(12) United States Patent
Shin et al.

(10) Patent No.: US 12,185,471 B2
(45) Date of Patent: Dec. 31, 2024

(54) ELECTRONIC COMPONENT EMBEDDED SUBSTRATE

(71) Applicant: SAMSUNG ELECTRO-MECHANICS CO., LTD., Suwon-si (KR)

(72) Inventors: Jae Ho Shin, Suwon-si (KR); Ga Young An, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 98 days.

(21) Appl. No.: 17/697,162

(22) Filed: Mar. 17, 2022

(65) Prior Publication Data
US 2023/0140708 A1     May 4, 2023

(30) Foreign Application Priority Data
Oct. 29, 2021 (KR) ........................ 10-2021-0146406

(51) Int. Cl.
*H05K 1/18* (2006.01)
*H05K 1/02* (2006.01)
(Continued)

(52) U.S. Cl.
CPC ........... *H05K 1/188* (2013.01); *H05K 1/0298* (2013.01); *H05K 1/09* (2013.01); *H05K 1/115* (2013.01); *H05K 1/183* (2013.01); *H05K 1/11* (2013.01); *H05K 1/185* (2013.01); *H05K 2201/10015* (2013.01)

(58) Field of Classification Search
CPC ........ H05K 1/188; H05K 1/0298; H05K 1/09; H05K 1/115; H05K 2201/10015; H05K 3/4644; H05K 2201/10636; H05K 1/185; H01L 23/49548; H01L 23/481; H01L 23/49565; H01L 23/49805; H01L 23/49827; H01L 23/49838; H01L 23/5226; H01L 23/5283

See application file for complete search history.

(56) References Cited

U.S. PATENT DOCUMENTS 6,388,207 B1 * 5/2002 Figueroa ................ H05K 1/115
                                                  257/E23.079
2012/0326569 A1    12/2012 Itagaki et al.
(Continued)

FOREIGN PATENT DOCUMENTS

KR           10-1514518 B1      4/2015
KR    10-2021-0081530 A      7/2021

OTHER PUBLICATIONS

U.S. Office Action dated Sep. 10, 2024 issued in U.S. Appl. No. 18/513,990.

*Primary Examiner* — Ishwarbhai B Patel
(74) *Attorney, Agent, or Firm* — Morgan, Lewis & Bockius LLP

(57) ABSTRACT

An electronic component embedded substrate includes: a core layer having a first through portion; an electronic component module including at least one electronic component and a metal layer surrounding at least a portion of the electronic component and disposed in the first through portion; and a first encapsulant disposed on the core layer, disposed in at least a portion of the first through portion, and covering at least a portion of the electronic component module.

26 Claims, 27 Drawing Sheets

(51) Int. Cl.
*H05K 1/09* (2006.01)
*H05K 1/11* (2006.01)

(56) References Cited

U.S. PATENT DOCUMENTS

| | | | |
|---|---|---|---|
| 2014/0055910 A1* | 2/2014 | Masuda | H01G 4/232 |
| | | | 361/303 |
| 2014/0076492 A1* | 3/2014 | Lai | H01L 23/49827 |
| | | | 156/280 |
| 2014/0347834 A1 | 11/2014 | Lee et al. | |
| 2015/0022937 A1* | 1/2015 | Park | H01G 17/00 |
| | | | 361/270 |
| 2018/0098430 A1* | 4/2018 | Sato | H01L 21/4857 |
| 2018/0350524 A1* | 12/2018 | Itamochi | H01G 4/232 |
| 2019/0122823 A1 | 4/2019 | Cho et al. | |
| 2020/0161202 A1 | 5/2020 | Lee et al. | |
| 2021/0183774 A1 | 6/2021 | Byun et al. | |
| 2021/0195750 A1* | 6/2021 | Lee | H05K 3/465 |

\* cited by examiner

III-III'

III-III'

III-III'

III-III'

ELECTRONIC COMPONENT EMBEDDED SUBSTRATE

CROSS-REFERENCE TO RELATED APPLICATION(S)

This application claims benefit of priority to Korean Patent Application No. 10-2021-0146406 filed on Oct. 29, 2021 in the Korean Intellectual Property Office, the disclosure of which is incorporated herein by reference in its entirety.

TECHNICAL FIELD

The present disclosure relates to an electronic component embedded substrate.

BACKGROUND

As technologies such as 5G, the $5^{th}$ generation technology standard for broadband cellular networks, and artificial intelligence (AI) are realized and need to be continuously and more rapidly developed, a system on chip (SoC) and an application specific integrated circuit (ASIC) that play an important role in these technologies are also required to have higher performance, such as faster operating speed and more power. In order to satisfy such a requirement, technological development has been carried out in various fields. In particular, as the importance of signal and power integration in designing circuits in a semiconductor field increases, electronic components such as various types of decoupling capacitors have been added to an electronic component embedded substrate or a package in order to improve the signal and power integration.

Such addition of the electronic component is important in improving performance of the electronic component embedded substrate or the package, but causes an increase in a size of the electronic component embedded substrate or package. In particular, since there may be a large difference in a degree of performance improvement depending on a position of the electronic component in the package, how and where to position the electronic component has become very important in designing the SoC and the ASIC.

SUMMARY

An aspect of the present disclosure may provide an electronic component embedded substrate in which at least one electronic component is embedded in a through portion.

An aspect of the present disclosure may also provide an electronic component embedded substrate in which a plurality of electronic components are embedded by increasing a mounting density of the electronic components.

An aspect of the present disclosure may also provide an electronic component embedded substrate with decreased parasitic inductance.

An aspect of the present disclosure may also provide an electronic component embedded substrate having improved signal transmission performance by integration of signals and power.

According to an aspect of the present disclosure, an electronic component embedded substrate may include: a core layer having a first through portion; an electronic component module including at least one electronic component and a metal layer surrounding at least a portion of the electronic component and disposed in the first through portion; and a first encapsulant disposed on the core layer, disposed in at least a portion of the first through portion, and covering at least a portion of the electronic component module.

According to another aspect of the present disclosure, an electronic component embedded substrate may include: a core layer having a first through portion penetrating through the core layer in a thickness direction of the core layer; an electronic component module including a plurality of electronic components disposed to at least partially overlap each other when viewed in the thickness direction, and a metal layer surrounding at least portions of the plurality of electronic components and disposed in the first through portion; and a first encapsulant disposed on the core layer, filling at least a portion of the first through portion, and covering at least a portion of the electronic component module, wherein the first encapsulant is in contact with at least portions of the plurality of electronic components.

According to another aspect of the present disclosure, an electronic component embedded substrate may include: a core layer having an upper surface and a lower surface, and including a first through portion penetrating trough the upper surface and the lower surface; a first electronic component disposed in the first through portion; a first metal layer disposed in the first through portion and including a first portion extending in a direction from the upper surface to the lower surface; a first connection conductor extending from the first portion to connect to the first electronic component; and an encapsulant disposed on the core layer and disposed in at least a portion of the first through portion.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

The meaning of a "connection" of a component to another component in the description conceptually includes an indirect connection through an adhesive layer as well as a direct connection between two components. In addition, "electrically connected" conceptually includes a physical connection and a physical disconnection. It may be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
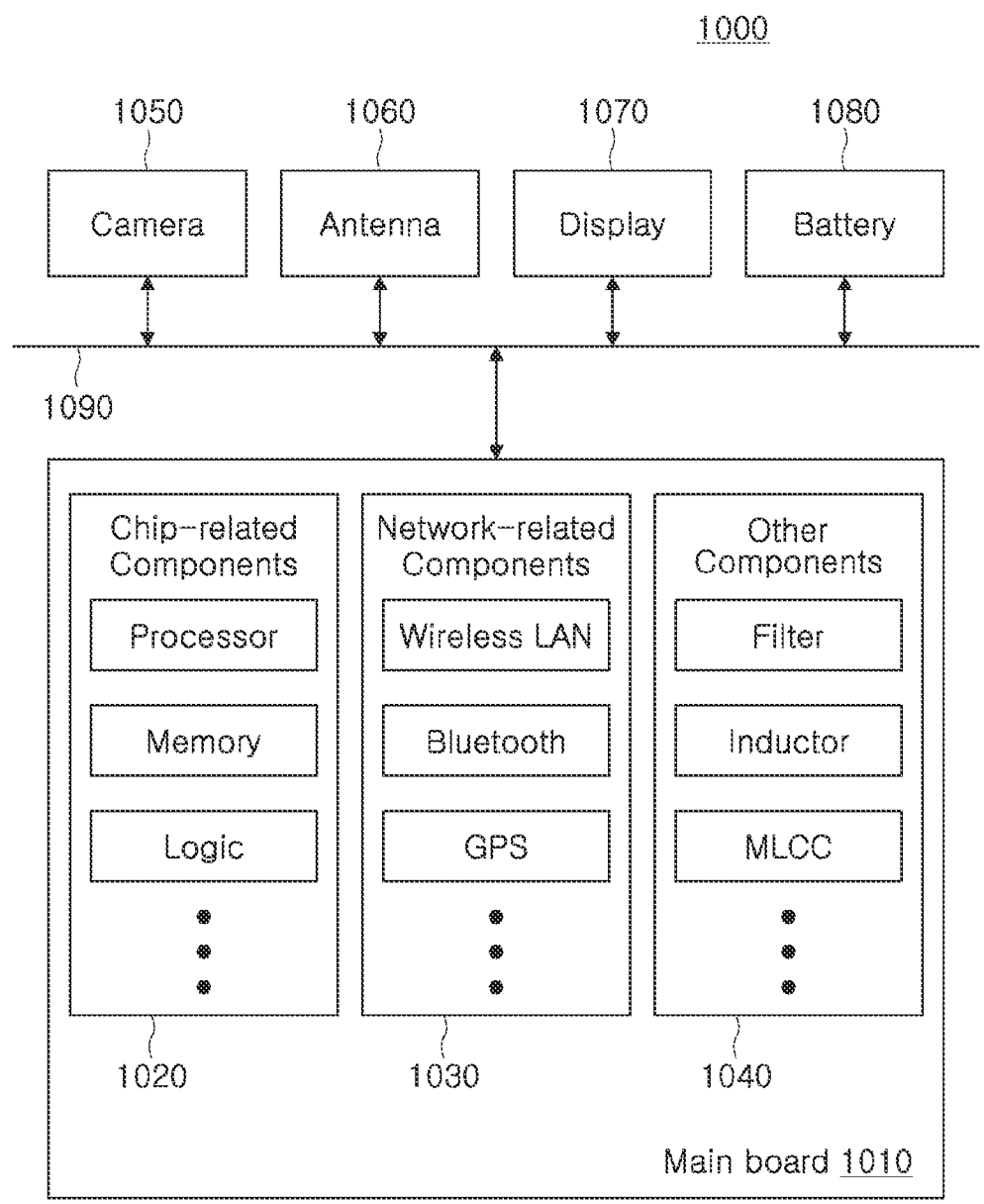
FIG. 1 is a schematic block diagram illustrating an example of an electronic device system according to an exemplary embodiment.

FIG. 1 is a schematic block diagram illustrating an example of an electronic device system according to an exemplary embodiment.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other. These chip related components 1020 may have a package form including the chips or the electronic components described above.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, these other components 1040 are not limited thereto, but may also include chip component types of passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other electronic components may include, for example, a camera 1050, an antenna 1060, a display 1070, a battery 1080, or the like. These other electronic components are not limited thereto, and may be an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. These other electronic components may also include other electronic components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
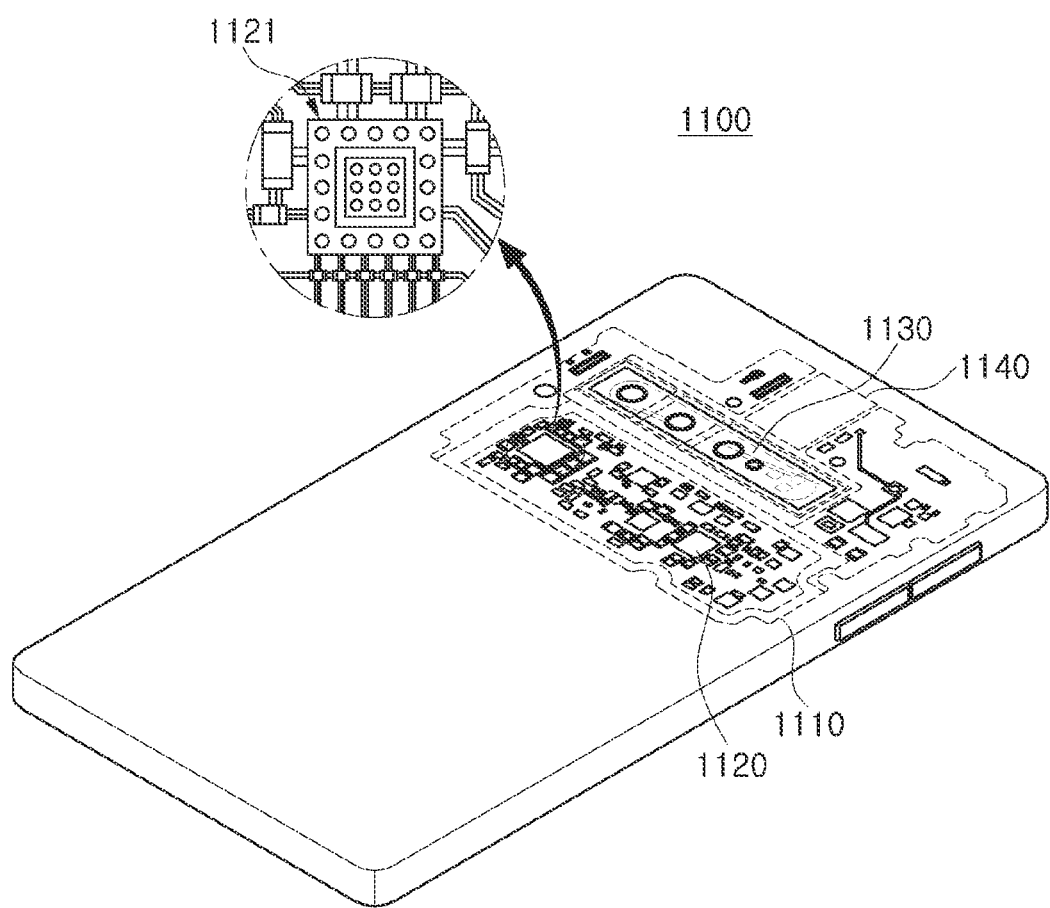
FIG. 2 is a schematic perspective view illustrating an electronic device according to an exemplary embodiment.

FIG. 2 is a schematic perspective view illustrating an electronic device according to an exemplary embodiment.

Referring to FIG. 2, an electronic device may be, for example, a smartphone 1100. A mainboard 1110 may be accommodated in the smartphone 1100, and various electronic components 1120 may be physically or electrically connected to the mainboard 1110. In addition, other components that may or may not be physically or electrically connected to the mainboard 1110, such as a camera module 1130 and/or a speaker 1140, may be accommodated in the smartphone 1100. Some of the electronic components 1120 may be the chip related components, for example, a semiconductor package 1121, but are not limited thereto. The semiconductor package 1121 may have a form in which a semiconductor chip or a passive component is surface-mounted on a package substrate having a form of a multi-layer electronic component embedded substrate, but is not limited thereto. Meanwhile, the electronic device is not necessarily limited to the smartphone 1100, but may be other electronic devices as described above.

Electronic Component Embedding Substrate

Figure 3:
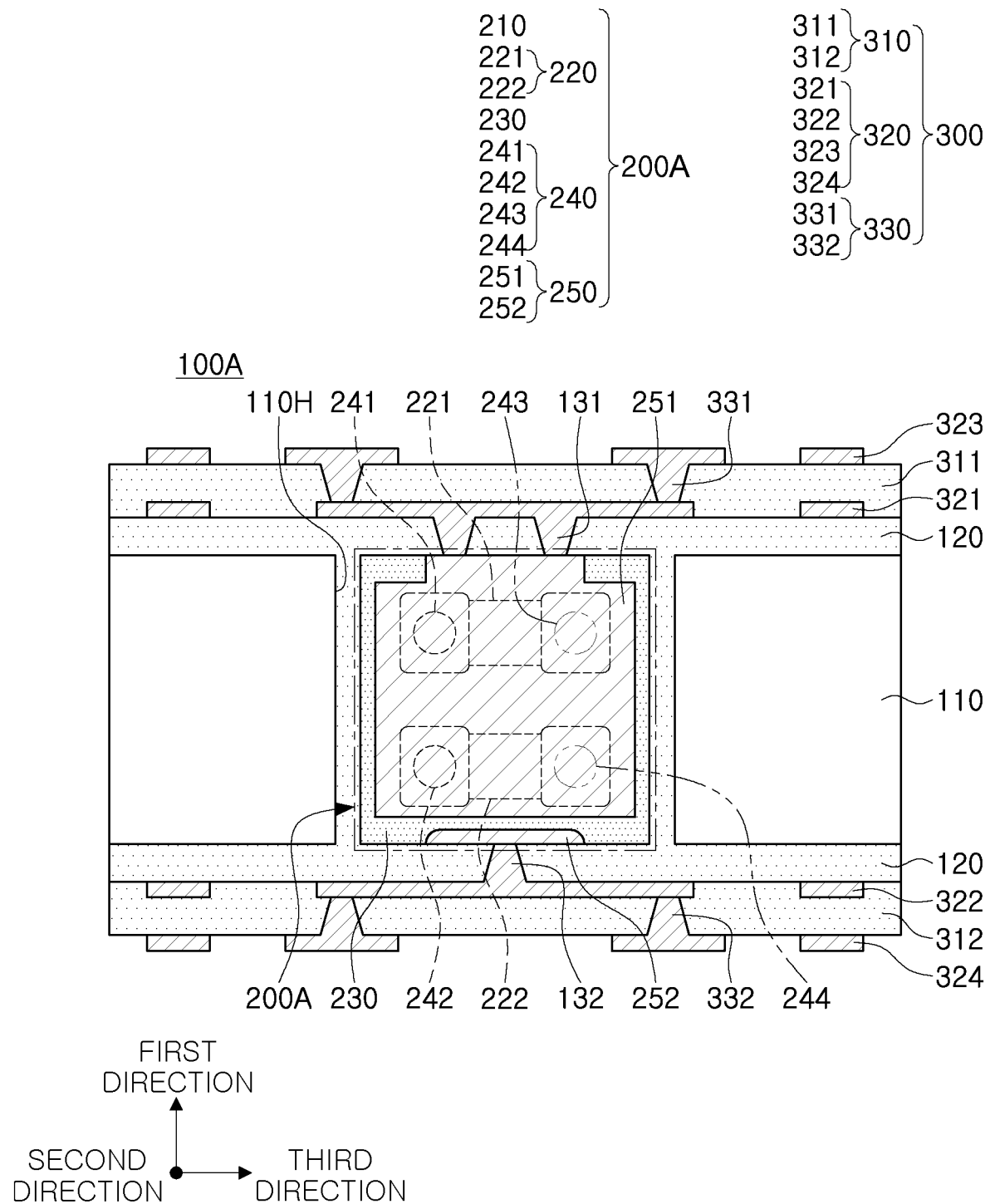
FIG. 3 is a schematic cross-sectional view illustrating an electronic component embedded substrate according to an exemplary embodiment.

FIG. 3 is a schematic cross-sectional view illustrating an electronic component embedded substrate according to an exemplary embodiment.

Referring to FIG. 3, an electronic component embedded substrate 100A according to an exemplary embodiment may include: a core layer 110 having a first through portion 110H; an electronic component module 200A disposed in the first through portion 110H; a first encapsulant 120 filling the first through portion 110H and covering at least a portion of each of the core layer 110 and the electronic component module 200A; a build-up structure 300 disposed on both sides of the core layer 110 and the first encapsulant 120 and including a plurality of wiring layers 321, 322, 323, and 324; first wiring vias 131 penetrating through at least portions of the first encapsulant 120 and connecting the electronic component module 200A and a first wiring layer 321 of the plurality of wiring layers to each other; and a second wiring via 132 penetrating through at least a portion of the first encapsulant 120 and connecting the electronic component module 200A and a second wiring layer 322 of the plurality of wiring layers to each other. If necessary, the electronic component embedded substrate 100A according to an exemplary embodiment may include a passivation layer (not illustrated) having openings on the build-up structure 300, and further including electrical connection metals (not illustrated) disposed in the openings.

In the present specification, in FIG. 3, an upper surface of the electronic component module 200A will be referred to as a first surface and a lower surface of the electronic component module 200A will be referred to as a second surface. In addition, a linear direction connecting the first surface and the second surface to each other will be referred to as a thickness direction or a stacking direction.

In addition, in the present specification, the thickness direction will be referred to as a first direction, a linear direction perpendicular to the first direction and connecting between two side surfaces of the electronic component module 200A opposing each other will be referred to as a second direction, and a direction orthogonal to the first and second directions will be referred to as a third direction.

In the present specification, a phrase "any component disposed on another component" is not limited to a case where any component is disposed on an upper side or an upper surface of another component. In some cases, any component may also be disposed on a lower side or a lower surface of another component.

The electronic component embedded substrate 100A according to an exemplary embodiment may have a structure in which at least one electronic component 220 is embedded in a second through portion 210H of the electronic component module 200A and the electronic component module 200A is embedded in the first through portion 110H of the core layer 110. The electronic component module 200A may have a form in which a plurality of electronic components 221 and 222 are stacked in a vertical direction and connected to each other in parallel, as described later.

The electronic component module 200A may be connected to a semiconductor package (not illustrated) or the like mounted on the electronic component embedded substrate 100A through the plurality of wiring layers 321, 322, 323, and 324 and a plurality of vias 331 and 332 included in the build-up structure 300. Accordingly, an electrical connection path between the plurality of electronic components 221 and 222 included in the electronic component module 200A and the semiconductor package (not illustrated) may be shortened. In addition, electrical signal loss and the like may be significantly decreased.

In addition, the plurality of electronic components 221 and 222 included in the electronic component module 200A may be arranged in vertical and horizontal directions. That is, at least one electronic component or a plurality of electronic components may be disposed, and in FIG. 3, the plurality of electronic components 221 and 222 may at least partially overlap each other when viewed from the first direction, which is the stacking direction. Accordingly, a large number of electronic components may be embedded by increasing a mounting density of the plurality of electronic components 221 and 222 mounted in the electronic component module 200A.

In addition, as described later, a yield may be improved by manufacturing the electronic component module 200A including the plurality of electronic components 221 and 222 in advance and embedding the electronic component module 200A in a substrate. In addition, a defective rate may be improved by performing a test before embedding the electronic component module 200A manufactured in advance in the substrate and selectively embedding the electronic component module 200A in the substrate.

In addition, the plurality of electronic components 221 and 222 included in the electronic component module 200A may be mounted in the first through portion 110H of the core layer 110 so as to be approximately symmetrical to each other in the first direction in which the first through portion 110H of the core layer 110 is formed, as illustrated in FIG. 3. Accordingly, warpage of the substrate may be suppressed.

Meanwhile, when a single electronic component disposed in the first through portion 110H has a thickness smaller than that of the core layer 110, warpage of the substrate may occur. In a case of the electronic component embedded substrate 100A according to the present disclosure, the plurality of electronic components 221 and 222 are stacked in the vertical direction, such that a thickness deviation between the electronic components 221 and 222 and the core layer 110 may be decreased to suppress a warpage defect, and a plurality of passive elements may be disposed, such that a function such as a filter function and a noise decrease function of the passive elements may be improved.

Meanwhile, although not illustrated, another semiconductor package (not illustrated) or an active device such as a semiconductor chip may be mounted on one surface of the electronic component embedded substrate 100A. As a distance between such a semiconductor package or active device and the plurality of electronic components 221 and 222 according to the present disclosure becomes small, a signal transmission distance may become short, such that signal characteristics may be improved. In the present disclosure, the plurality of electronic components 221 and 222 may be vertically arranged along the first direction, and a distance between the plurality of electronic components 221 and 222 and a component disposed on one surface of the electronic component embedded substrate 100A may thus be shortened.

Meanwhile, when the plurality of electronic components 221 and 222 of the electronic component embedded substrate 100A are passive elements, the plurality of electronic components 221 and 222 may be connected to power patterns or ground patterns, and may be components through which signals pass at the time when the signals are transferred. The plurality of electronic components 221 and 222 may be disposed, and parasitic inductance may thus be decreased.

Meanwhile, the plurality of electronic components 221 and 222 may be passive components having electrodes, respectively, as described later, and the respective passive components may be electrically connected to metal layers 251 and 252 by connection conductors 241, 242, 243, and 244. Since the respective passive components are directly connected to each other by the connection conductors 241, 242, 243, and 244, generation of noise due to the introduction of separate wiring layers may be suppressed, and capacitance may be increased.

Meanwhile, the electronic component module 200A may be embedded in the first through portion 110H formed in the core layer 110 of the electronic component embedded substrate 100A, and the electronic components 221 and 222 may be embedded in the second through portion 210H formed in a support member 210 (shown in FIG. 4) of the electronic component module 200A. In this case, the first through portion 110H may penetrate through the core layer 110 along the first direction, and the second through portion 210H may penetrate through the support member 210 along the second direction. Since a process of embedding the plurality of electronic components 221 and 222 in the second through portion 210H is first performed and the electronic component module 200A is then rotated as needed to be disposed in the first through portion 110H, the plurality of electronic components 221 and 222 may be effectively disposed along the thickness direction.

Hereinafter, respective components included in the electronic component embedded substrate 100A according to an exemplary embodiment will be described in more detail.

The core layer 110 may serve to suppress warpage of the electronic component embedded substrate by promoting rigidity of the electronic component embedded substrate. A material of the core layer 110 is not particularly limited, and may be any material having an insulating property. For example, a thermosetting resin such as an epoxy resin, a thermoplastic resin such as polyimide, or a resin further including a reinforcing material such as an inorganic filler and/or a glass cloth (or a glass fabric) in addition to the thermosetting resin or the thermoplastic resin, for example, prepreg, Ajinomoto Build-up Film (ABF), FR-4, Bismaleimide Triazine (BT), or the like, may be used. If necessary, a photoimagable dielectric (PID) resin may also be used.

Electronic Component Module

Figure 4:
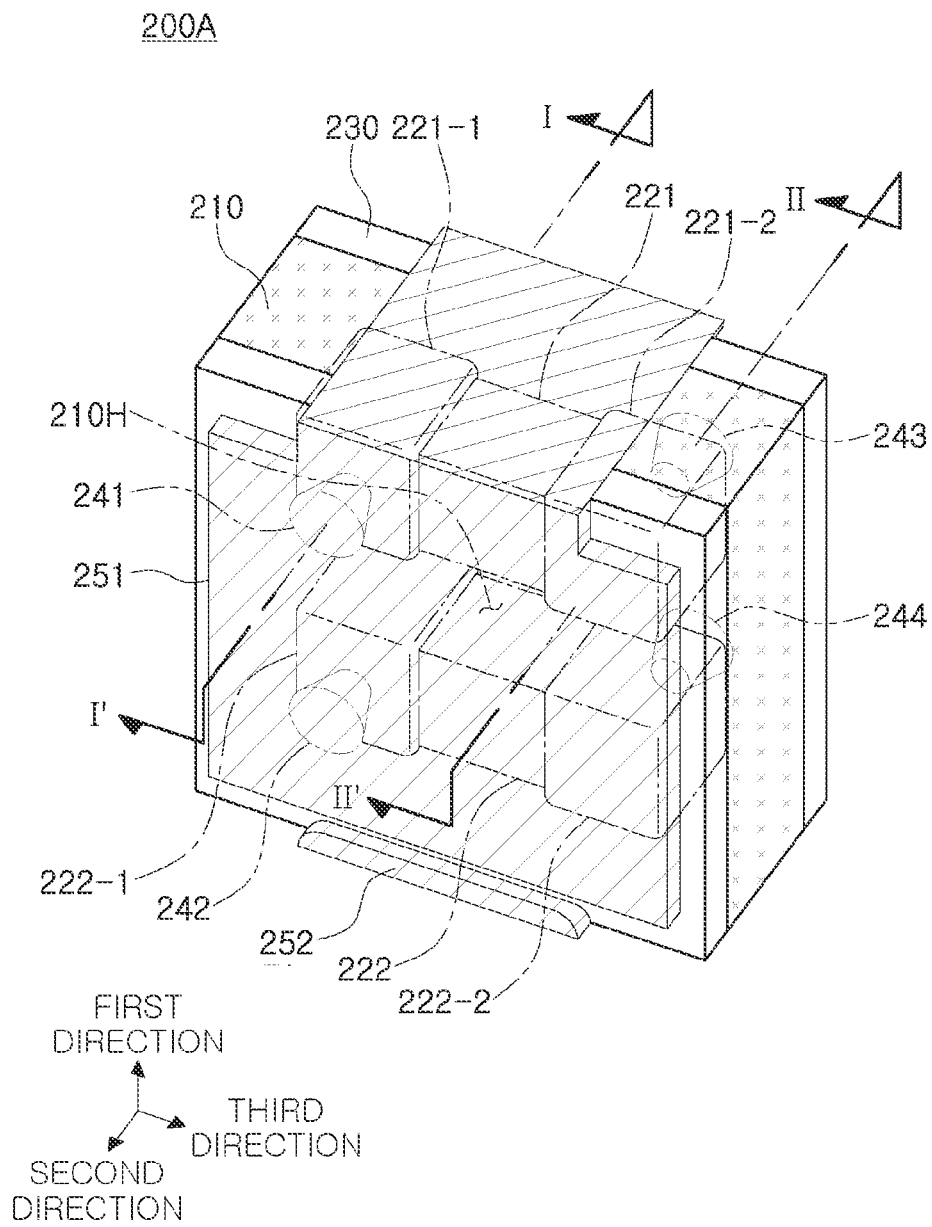
FIG. 4 is a schematic perspective view illustrating an electronic component module according to an exemplary embodiment.

FIG. 4 is a schematic perspective view illustrating an electronic component module according to an exemplary embodiment.

Figure 5A:
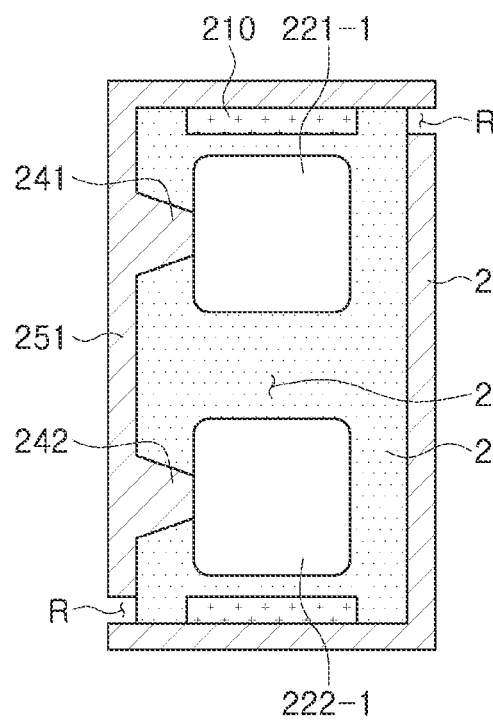
FIGS. 5A and 5B are schematic cross-sectional views illustrating the electronic component module according to an exemplary embodiment.
Figure 5B:
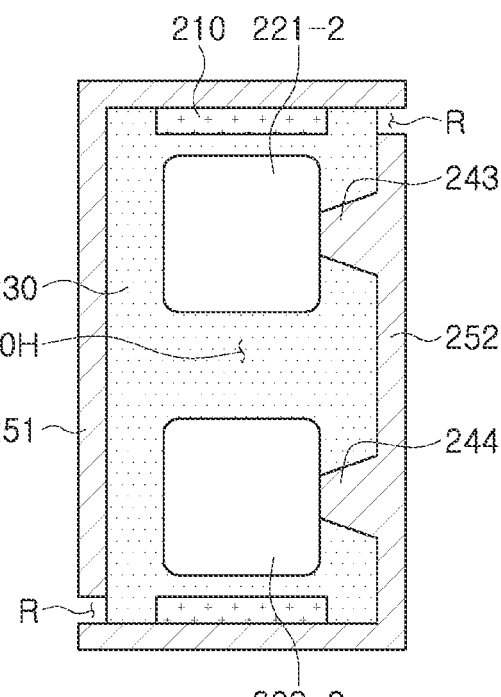

FIGS. 5A and 5B are schematic cross-sectional views illustrating the electronic component module according to an exemplary embodiment.

Figure 6:
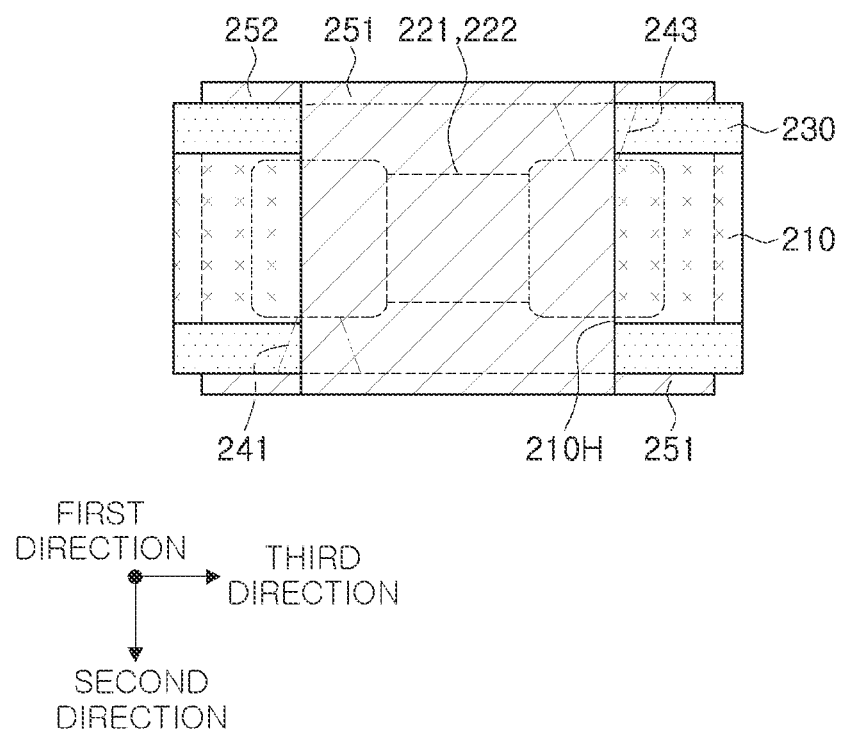
FIG. 6 is a schematic plan view illustrating the electronic component module according to an exemplary embodiment.

FIG. 6 is a schematic plan view illustrating the electronic component module according to an exemplary embodiment.

The electronic component module 200A according to an exemplary embodiment may include: the support member 210 having the second through portion 210H; one or more electronic components 221 and 222 disposed in the second through portion 210H; a second encapsulant 230 filling at least a portion of the second through portion 210H and covering at least portions of the support member 210 and each of one or more electronic components 221 and 222; first and second metal layers 251 and 252 disposed on the second encapsulant 230 so as to be spaced apart from each other; first and second connection conductors 241 and 242 penetrating through at least portions of the second encapsulant 230, having side surfaces covered with the second encapsulant 230, and connecting the first metal layer 251 and one or more electronic components 221 and 222 to each other, respectively; and third and fourth connection conductors 243 and 244 penetrating through at least portions of the second encapsulant 230, having side surfaces covered with the second encapsulant 230, and connecting the second metal layer 252 and one or more electronic components 221 and 222 to each other, respectively.

In this case, a direction in which the second through portion 210H penetrates through the support member 210 may be the second direction, and the second direction may be perpendicular to the first direction, which is a direction in which the first through portion 110H penetrates through the core layer 110. Each of the first and second through portions 110H and 210H may be formed by a sand blasting method using polishing particles, a dry etching method using plasma, a mechanical drill, a laser drill, or the like.

A material of the support member 210 is not particularly limited, and may be any material having an insulating property. For example, a thermosetting resin such as an epoxy resin, a thermoplastic resin such as polyimide, or a resin further including a reinforcing material such as an inorganic filler and/or a glass cloth (or a glass fabric) in addition to the thermosetting resin or the thermoplastic resin, for example, prepreg, ABF, FR-4, BT, or the like, may be used. If necessary, a PID resin may also be used.

At least one electronic component 220 may include only a single electronic component or may include a plurality of electronic components 220 (for example, two or more electronic components) as illustrated in FIG. 3. In the following detailed description of the present specification, a structure in which the electronic component 220 includes the plurality of electronic components 221 and 222 by disposing the plurality of electronic components will be basically described. For example, the plurality of electronic components 220 may include a first electronic component 221 and a second electronic component 222.

Each of the first and second electronic components 221 and 222 may be a chip-type capacitor having electrodes. For example, each of the first and second electronic components 221 and 222 may be a multilayer ceramic capacitor (MLCC), but is not limited thereto. In this case, one electrodes of the first and second electronic components 221 and 222 may be connected to the first metal layer 251 by the first connection conductor 241 and the second connection conductor 242, respectively. In addition, the other electrodes of the first and second electronic components 221 and 222 may be connected to the second metal layer 252 by the third and fourth connection conductors 243 and 244, respectively That is, referring to FIG. 4, the first and second electronic components 221 and 222 may include first electrodes 221-1 and 222-1 and second electrodes 221-2 and 222-2, respectively, and each of the first electrodes 221-1 and 222-1 may be connected to the first metal layer 251 and each of the second electrodes 221-2 and 222-2 may be connected to the second metal layer 252. However, the present disclosure is not limited thereto, and each of the first and second electronic components 221 and 222 may be a passive component such as an inductor, or may be an active component such as an integrated circuit (IC) or a semiconductor chip.

Referring to FIGS. 4 to 5B, in this case, the first and second electronic components 221 and 222 may be disposed to be spaced apart from each other by a predetermined distance within the second through portion 210H. In addition, a space between the first and second electronic components 221 and 222 may be filled with the second encapsulant 230. Accordingly, the first and second electronic components 221 and 222 may be spaced apart from each other by the second encapsulant 230.

The first and second electronic components 221 and 222 may be disposed along the thickness direction of the electronic component embedded substrate 100A, and may be stacked to overlap each other in plan view. That is, when viewed from the first direction, the first and second electronic components 221 and 222 may be disposed to at least partially overlap each other.

The second encapsulant 230 may cover at least portions of the support member 210 and each of the first and second electronic components 221 and 222. In addition, the second encapsulant 230 may fill at least a portion of the second through portion 210H.

A material of the second encapsulant 230 is not particularly limited, and may be any material having an insulating property. For example, a thermosetting resin such as an epoxy resin, a thermoplastic resin such as polyimide, or a resin further including a reinforcing material such as an inorganic filler and/or a glass cloth (or a glass fabric) in addition to the thermosetting resin or the thermoplastic resin, for example, prepreg, ABF, FR-4, BT, or the like, may be used. If necessary, a PID resin may also be used.

A boundary between the second encapsulants 230 each disposed on one surface and the other surface of the support member 210 opposing each other may not be apparent according to a material, a process, and the like, of the second encapsulants 230. That is, in a stacking process to be described later, the second encapsulants 230 each disposed on one surface and the other surface of the support member 210 opposing each other may be integrated with each other or a boundary surface between the second encapsulants 230 may become unclear, such that such a boundary surface in a structure of a completed electronic component embedded substrate may not be readily apparent with the naked eyes. In some cases, only portions of the second encapsulants 230 may have a boundary surface therebetween.

A metal layer 250 may include the first and second metal layers 251 and 252. As illustrated in the cross-sectional view of FIGS. 5A and 5B, the first and second metal layers 251 and 252 may be disposed to be spaced apart from each other by a predetermined distance. The first and second metal layers 251 and 252 may be each disposed on the second encapsulants 230. The first metal layer 251 may cover most of the second encapsulant 230 disposed on one surface of the support member 210, may extend to and be disposed on a side surface of the support member 210, and may extend up to and be disposed on an upper portion of the second encapsulant 230 disposed on the other surface of the support member 210. Meanwhile, the second metal layer 252 may cover most of the second encapsulant 230 disposed on the other surface of the support member 210, may extend to and be disposed on the other side surface of the support member 210 opposing the side surface of the support member 210 to which the first metal layer 251 extends, and may extend up to and be disposed on an upper portion of the second encapsulant 230 disposed on one surface of the support member 210.

As illustrated in FIGS. 4 to 5B, the first and second metal layers 251 and 252 may be disposed to be spaced apart from each other by a predetermined distance, and recess parts R having a groove shape may be formed in areas in which the first and second metal layers 251 and 252 are spaced apart from each other. The second encapsulants 230 may be exposed through the recess parts R, and the exposed second encapsulants 230 may be in contact with first encapsulants 120 to be described later.

The first and second metal layers 251 and 252 may be connected to each of the first and second electronic components 221 and 222 through first to fourth connection conductors 241, 242, 243, and 244 to be described later. Since the first and second metal layers 251 and 252 extend to and are disposed on the side surfaces of the support member 210, even though the electronic component module 200A is manufactured and then rotated by about 90° as in a process to be described later, the first and second metal layers 251 and 252 may be in contact with and connected to the first and second wiring vias 131 and 132 at the shortest distance. Accordingly, a signal transmission distance may be shortened, signal transfer characteristics with an active element (not illustrated) disposed on the electronic component embedded substrate 100A may be improved, and parasitic capacitance may be decreased.

The first connection conductor 241 may connect the first electronic component 221 and the first metal layer 251 to each other, the second connection conductor 242 may connect the second electronic component 222 and the first metal layer 251 to each other, the third connection conductor 243 may connect the first electronic component 221 and the second metal layer 252 to each other, and the fourth connection conductor 244 may connect the second electronic component 222 and the second metal layer 252 to each other. The first and third connection conductors 241 and 243 may be disposed on the same level as the first electronic component 221, and the second and fourth connection conductors 242 and 244 may be disposed on the same level as the second electronic component 222. In addition, at least a portion of each of the first to fourth connection conductors 241, 242, 243, and 244 may be embedded in the second encapsulant 230.

Each of the first to fourth connection conductors 241, 242, 243, and 244 may be formed by completely filling an inner portion of each of first to fourth connection conductor holes 241h, 242h, 243h, and 244h with a conductive material or be formed by forming a conductive material along a wall of each of the first to fourth connection conductor holes. When the connection conductor is formed by forming the conductive material along the wall of the connection conductor hole, an inner portion of the connection conductor hole may be filled with the second encapsulant 230.

FIGS. 5A and 5B are, respectively, cross-sectional views taken along lines I-I' and II-II' of the perspective view of FIG. 4.

Referring to FIG. 5A, the first and second connection conductors 241 and 242 disposed on one surfaces of the first and second electronic components 221 and 222, respectively, are illustrated. The first connection conductor 241 may electrically connect the first electronic component 221 and the first metal layer 251 to each other, and the second connection conductor 242 may electrically connect the second electronic component 222 and the first metal layer 251 to each other. Specifically, the first connection conductor 241 may electrically connect the first electrode 221-1 of the first electronic component 221 and the first metal layer 251 to each other, and the second connection conductor 242 may electrically connect the first electrode 222-1 of the second electronic component 222 and the first metal layer 251 to each other.

Meanwhile, the first and second metal layers 251 and 252 may be spaced apart from each other by a predetermined distance with the recess parts R interposed therebetween on one surface and the other surface of the second encapsulant 230.

Referring to FIG. 5B, the third and fourth connection conductors 243 and 244 disposed on the other surfaces of the first and second electronic components 221 and 222, respectively, are illustrated. The third connection conductor 243 may electrically connect the first electronic component 221 and the second metal layer 252 to each other, and the fourth connection conductor 244 may electrically connect the second electronic component 222 and the second metal layer 252 to each other. Specifically, the third connection conductor 243 may electrically connect the second electrode 221-2 of the first electronic component 221 and the second metal layer 252 to each other, and the fourth connection conductor 244 may electrically connect the second electrode 222-2 of the second electronic component 222 and the second metal layer 252 to each other.

Meanwhile, the first and second metal layers 251 and 252 may be spaced apart from each other by a predetermined distance with the recess parts R interposed therebetween on one surface and the other surface of the second encapsulant 230.

FIG. 6 is a plan view of the electronic component module 200A rotated in order to be embedded in the first through portion 110H, when viewed from the first direction. Referring to FIG. 6, the first and second metal layers 251 and 252 may be disposed on one surface and the other surface of the electronic component module 200A, respectively, and the first or second metal layers 251 or 252 may extend to and be disposed on a side surface of the electronic component module 200A. The first metal layer 251 may be disposed on a side surface of the electronic component module 200A viewed from the first direction of FIG. 6.

Meanwhile, a structure of the electronic component module 200A according to an exemplary embodiment is not limited thereto, and may be freely changed within the range that may be desired by those skilled in the art. For example, the number of each of support members, electronic components, encapsulants, and connection conductors included in the electronic component module 200A according to an exemplary embodiment may be more than or less than that illustrated in the drawings.

The first encapsulants 120 may be each disposed on one surface and the other surface of the core layer 110 opposing each other to fill at least a portion of the first through portion 110H and cover at least a portion of the electronic component module 200A.

A material of the first encapsulant 120 is not particularly limited, and may be any material having an insulating property. For example, a thermosetting resin such as an epoxy resin, a thermoplastic resin such as polyimide, or a resin further including a reinforcing material such as an inorganic filler and/or a glass cloth (or a glass fabric) in addition to the thermosetting resin or the thermoplastic resin, for example, prepreg, ABF, FR-4, BT, or the like, may be used. If necessary, a PID resin may also be used.

A boundary between the first encapsulants 120 each disposed on one surface and the other surface of the core layer 110 opposing each other may not be apparent according to a material, a process, and the like, of the first encapsulants 120. That is, in a stacking process to be described later, the first encapsulants 120 each disposed on one surface and the other surface of the core layer 110 opposing each other may be integrated with each other or a boundary surface between the first encapsulants 120 may become unclear, such that such a boundary surface in the structure of the completed electronic component embedded substrate may not be readily apparent with the naked eyes. In some cases, only portions of the first encapsulants 120 may have a boundary surface therebetween.

The build-up structure 300 may include: the first wiring layer 321 disposed on the first encapsulant 120 disposed on one surface of the core layer 110; a first insulating layer 311 disposed on the first encapsulant 120 and covering the first wiring layer 321; a third wiring layer 323 disposed on the first insulating layer 311; first vias 331 penetrating through the first insulating layer 311 and connecting the first wiring layer 321 and the third wiring layer 323 to each other; the second wiring layer 322 disposed on the first encapsulant 120 disposed on the other surface of the core layer 110; a second insulating layer 312 disposed on the first encapsulant 120 and covering the second wiring layer 322; a fourth wiring layer 324 disposed on the second insulating layer 312; and second vias 332 penetrating through the second insulating layer 312 and connecting the second wiring layer 322 and the fourth wiring layer 324 to each other.

However, a structure of the build-up structure 300 is not limited thereto, and may be freely changed within the range that may be desired by those skilled in the art. For example, the number of insulating layers, wiring layers, and/or vias included in the build-up structure 300 may be more than or less than that illustrated in the drawings.

A material of each of the first and second insulating layers 311 and 312 is not particularly limited, and may be any material having an insulating property. For example, a thermosetting resin such as an epoxy resin, a thermoplastic resin such as polyimide, or a resin further including a reinforcing material such as an inorganic filler and/or a glass cloth (or a glass fabric) in addition to the thermosetting resin or the thermoplastic resin, for example, prepreg, ABF, FR-4, BT, or the like, may be used. If necessary, a PID resin may also be used.

A boundary between the first and second insulating layers 311 and 312 may not be apparent according to a material, a process, and the like, of each of the first and second insulating layers 311 and 312. That is, in a stacking process, the first and second insulating layers 311 and 312 may be integrated with each other or a boundary surface between the first and second insulating layers 311 and 312 may become unclear, such that such a boundary surface in the structure of the completed electronic component embedded substrate may not be readily apparent with the naked eyes.

Furthermore, boundaries between the first and second insulating layers 311 and 312 and the first encapsulants 120 may also not be apparent according to a material, a process, and the like, of each of the first and second insulating layers 311 and 312 and the first encapsulants 120. That is, in a stacking process, the first and second insulating layers 311 and 312 and the first encapsulants 120 may be integrated with each other or boundary surfaces between the first and second insulating layers 311 and 312 and the first encapsulants 120 may become unclear, such that such boundary surfaces in the structure of the completed electronic component embedded substrate may not be readily apparent with the naked eyes.

A material of each of the first to fourth wiring layers 321, 322, 323, and 324 may be a conductive material such as copper (Cu), aluminum (Al), silver (Ag), tin (Sn), gold (Au), nickel (Ni), lead (Pb), titanium (Ti), or alloys thereof. Each of the first to fourth wiring layers 321, 322, 323, and 324 may perform various functions depending on its design. For example, each of the first to fourth wiring layers 321, 322, 323, and 324 may include ground (GND) patterns, power (PWR) patterns, signal (S) patterns, and the like. Here, the signal (S) patterns may include various signals except for the ground (GND) patterns, the power (PWR) patterns, and the like, such as data signals. In addition, each of the first to fourth wiring layers 321, 322, 323, and 324 may include via pads, and the like.

The first and second wiring vias 131 and 132 may penetrate through at least portions of the first encapsulant 120 disposed on one surface of the core layer 110 and at least a portion of the encapsulant 120 disposed on the other surface of the core layer 110, respectively.

The first and second wiring layers 321 and 322 may be connected to the electronic component module 200A by the first and second wiring vias 131 and 132 penetrating through the first encapsulants 120, respectively. Specifically, the first wiring layer 321 may be connected to the first metal layer 251 of the electronic component module 200A through the first wiring vias 131 penetrating through the first encapsulant 120, and the second wiring layer 322 may be connected to the second metal layer 252 of the electronic component module 200A through the second wiring via 132 penetrating through the first encapsulant 120.

Meanwhile, although not illustrated, the electronic component embedded substrate 100A according to an exemplary embodiment may further include through vias (not illustrated), if necessary. When the through vias are formed, the through vias may penetrate at least portions of the core layer 110 and each of the first encapsulants 120, and may electrically connect the first and second wiring layers 321 and 322 to each other. A material of each of the through vias may be a conductive material such as copper (Cu), aluminum (Al), silver (Ag), tin (Sn), gold (Au), nickel (Ni), lead (Pb), titanium (Ti), or alloys thereof.

A material of each of the first and second vias 331 and 332 and the first and second wiring vias 131 and 132 may be a conductive material such as copper (Cu), aluminum (Al), silver (Ag), tin (Sn), gold (Au), nickel (Ni), lead (Pb), titanium (Ti), or alloys thereof. Each of the first and second vias 331 and 332 and the first and second wiring vias 131 and 132 may be formed by completely filling each of via holes with the conductive material or be formed by forming the conductive material along a wall of each of via holes. When each of the first and second vias 331 and 332 and the first and second wiring vias 131 and 132 is formed by forming the conductive material along the wall of each of the via holes, an inner portion of the via hole may be filled with an insulating material. In addition, each of the first and second vias 331 and 332 and the first and second wiring vias 131 and 132 may have any shape known in the related art, such as a tapered shape and a cylindrical shape.

Although not illustrated, the passivation layer may be disposed on the build-up structure 300 to protect internal components of the electronic component embedded substrate 100A according to an exemplary embodiment from external physical and chemical damage or the like. The passivation layer may include a thermosetting resin and an inorganic filler. For example, the passivation layer may be ABF. However, the passivation layer is not limited thereto, and may be a known photosensitive insulating layer such as a solder resist (SR) layer.

The passivation layer (not illustrated) may have one or more openings (not illustrated) exposing at least portions of wiring layers disposed at the outermost portion of the build-up structure 300. In this case, a surface treatment layer may be formed on a surface of each of the exposed wiring layers. The surface treatment layer may be formed by, for example, gold plating, tin plating, silver plating, nickel plating, or the like. If necessary, the openings of the passivation layer may be formed of a plurality of via holes.

FIGS. 7A through 17 are views illustrating processes of manufacturing the electronic component embedded substrate of FIG. 3.

Figure 10A:
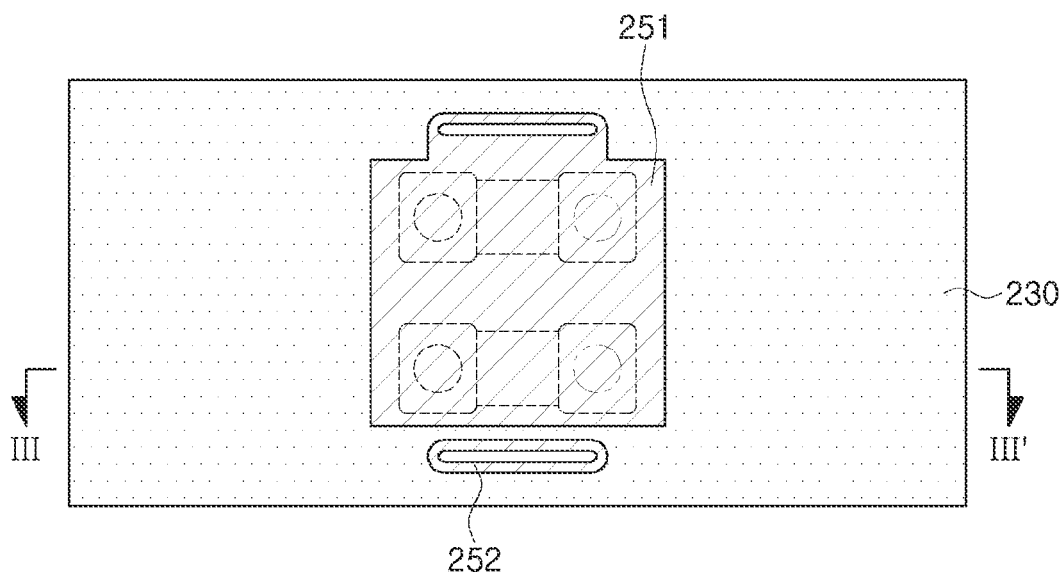
Figure 10B:
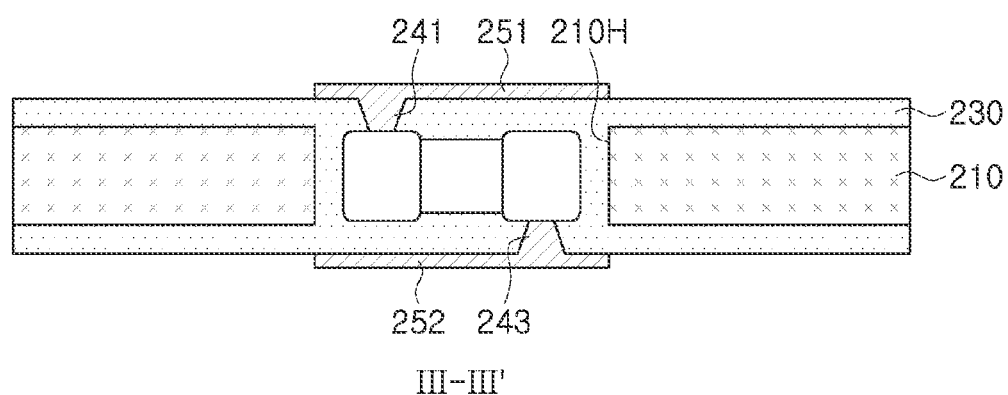
Figure 11A:
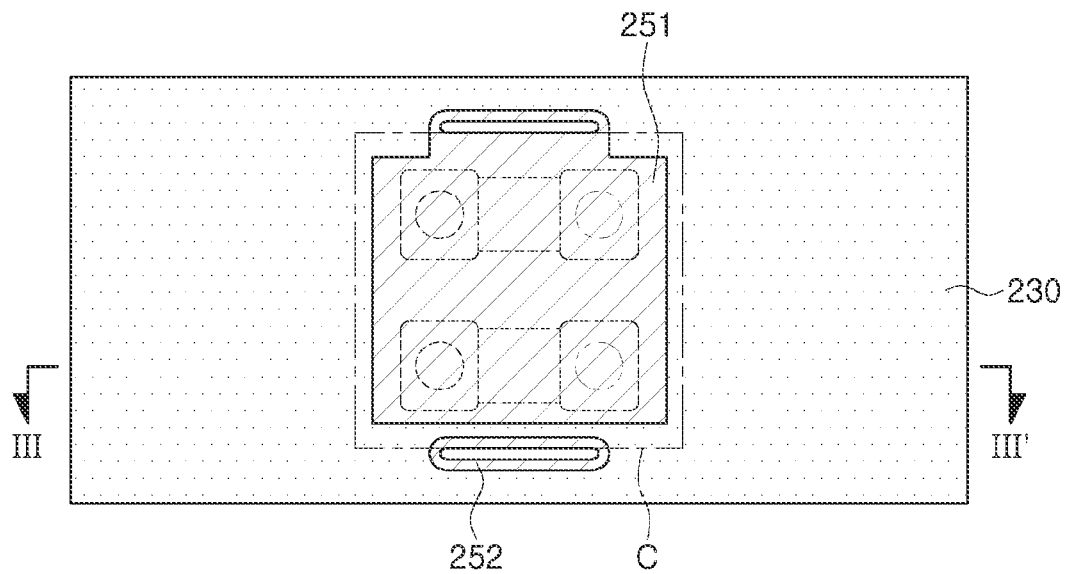
Figure 11B:
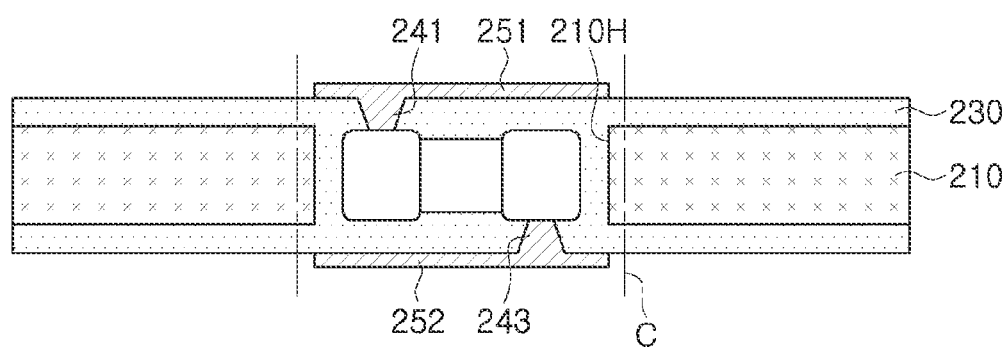
Figure 12:
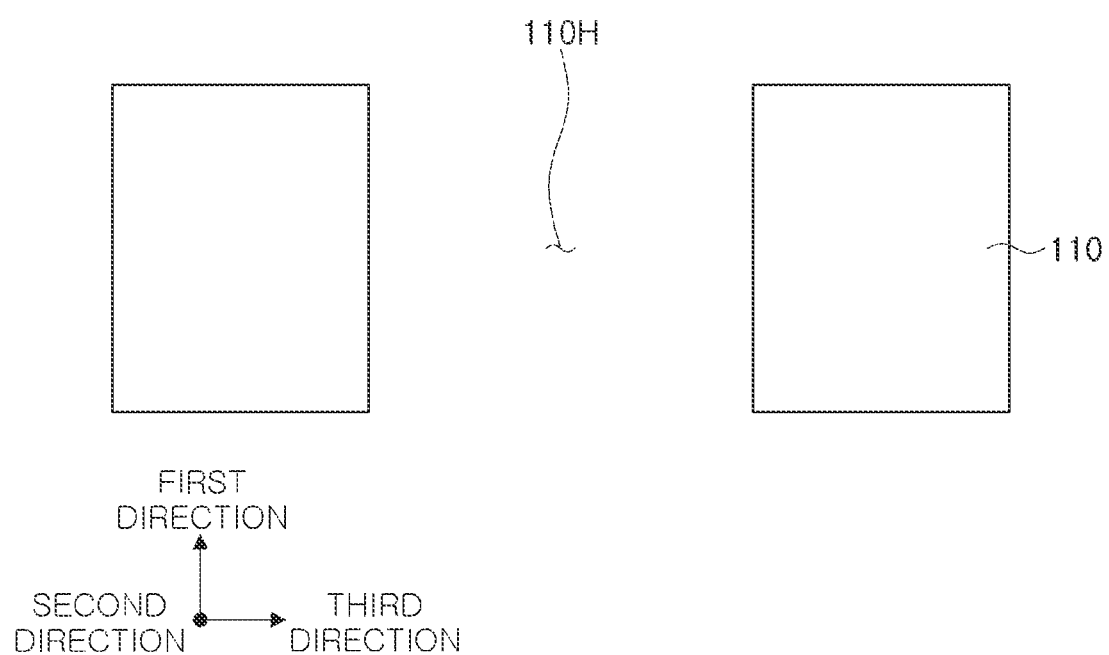
Figure 13:
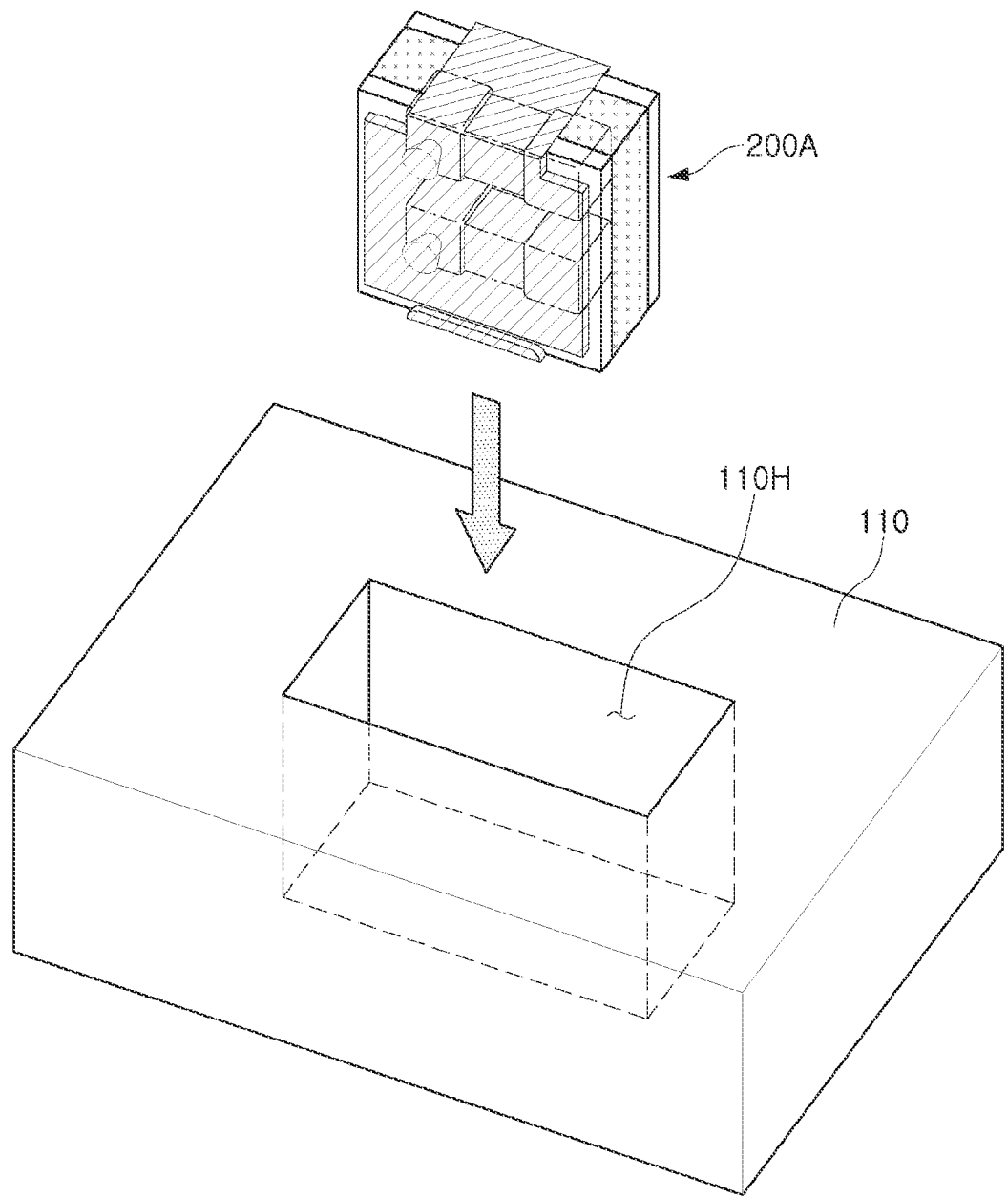
Figure 14:
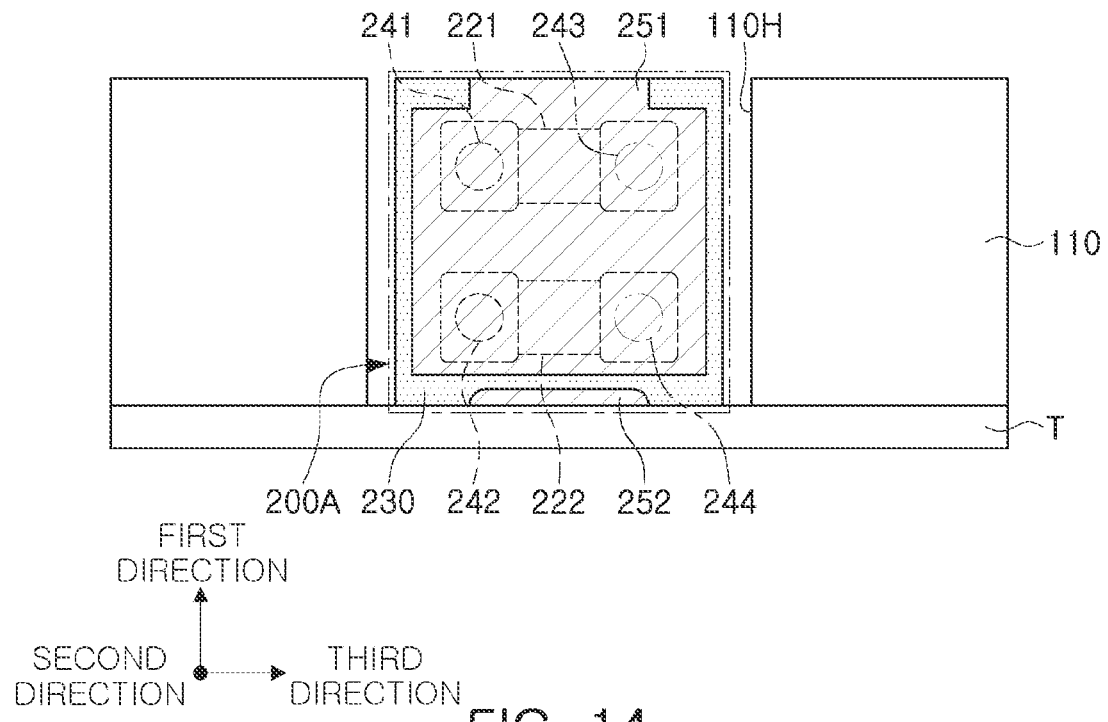

FIGS. 7A through 11B illustrate processes of manufacturing the electronic component module 200A according to an exemplary embodiment, and FIG. 12 through to 17 illustrate processes of manufacturing the electronic component embedded substrate 100A according to an exemplary embodiment.

Figure 7A:
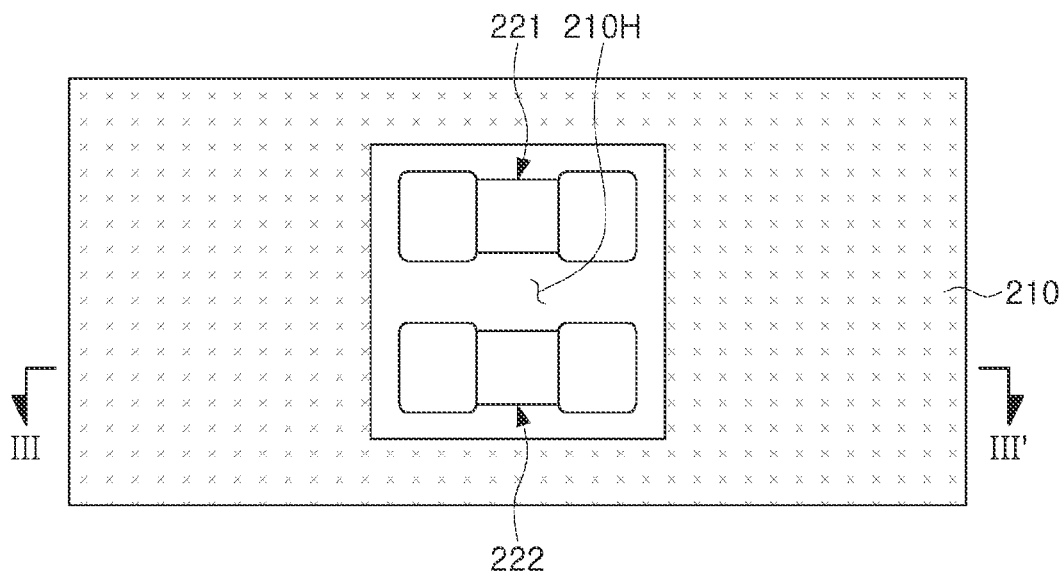
FIGS. 7A through 17 are views illustrating processes of manufacturing the electronic component embedded substrate of FIG. 3.
Figure 7B:
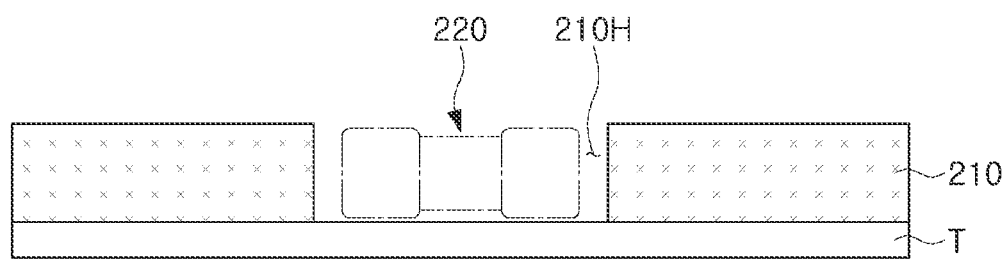

Referring to FIGS. 7A and 7B, first, the second through portion 210H may be formed in the support member 210. The second through portion 210H may be formed by a sand blasting method using polishing particles, a dry etching method using plasma, a mechanical drill, a laser drill, or the like. When the second through portion 210H is formed using the mechanical drill or the laser drill, a desmear process such as a permanganate method, or the like, may be performed to remove resin smear in the second through portion 210H.

Thereafter, the first and second electronic components 221 and 222 may be disposed in parallel in the second through portion 210H using an adhesive such as a tape T attached to the other surface of the support member 210. In this case, the number of electronic components may be more than or less than that illustrated in FIGS. 7A and 7B.

A material of the tape T is not particularly limited, and may be any material that may fix the first and second electronic components 221 and 222 to the support member 210. An example of the tape may include a thermosetting adhesive tape of which adhesion is weakened by heat treatment, an ultraviolet-curable adhesive tape of which adhesion is weakened by ultraviolet ray irradiation, or the like.

The first and second electronic components 221 and 222 may be disposed in a manner of attaching the first and second electronic components 221 and 222 onto the tape T exposed to the second through portion 210H. Each of the first and second electronic components 221 and 222 may be disposed to be spaced apart from the support member 210 by a predetermined distance, and the first and second electronic components 221 and 222 may also be disposed to be spaced apart from each other by a predetermined distance.

Figure 8A:
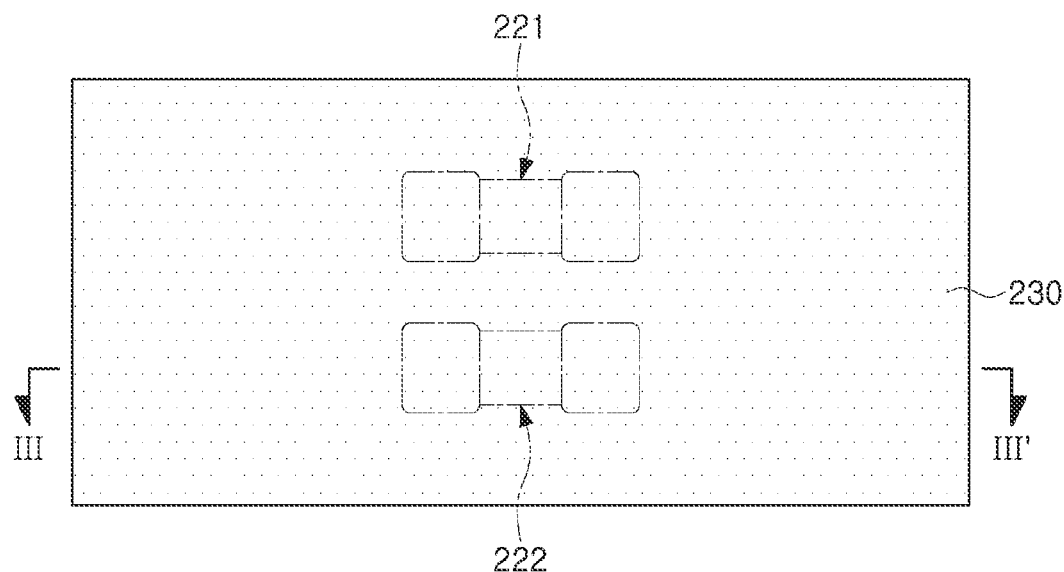
Figure 8B:
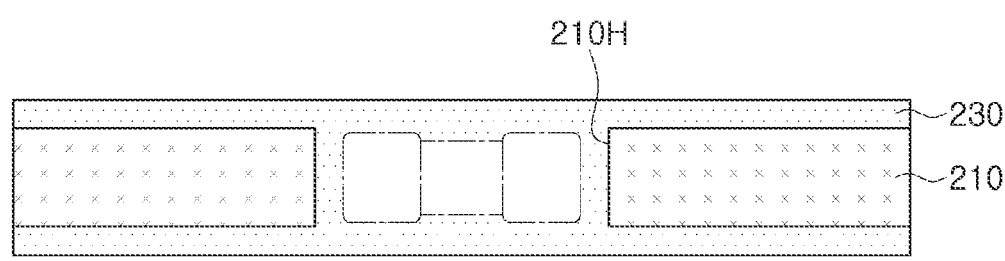
Figure 9A:
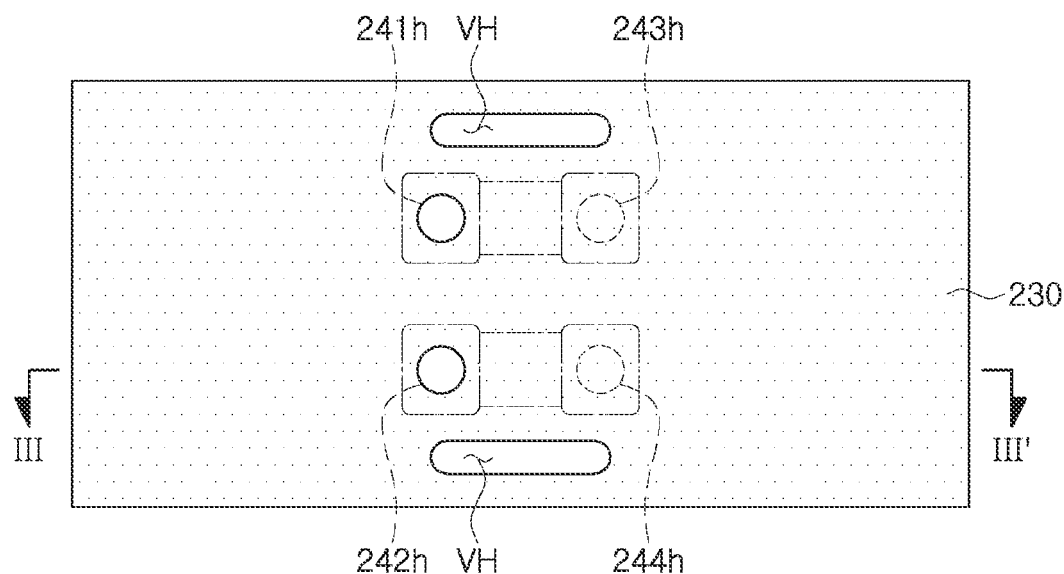
Figure 9B:
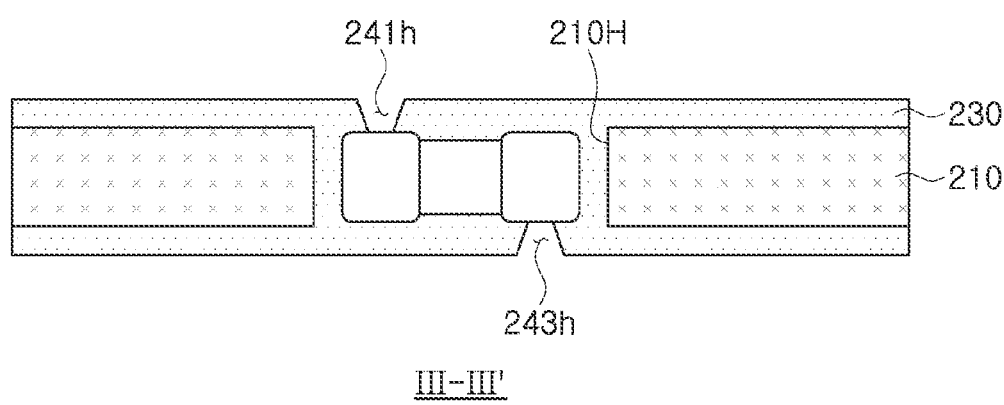

Next, referring to FIGS. 8A and 8B, the second encapsulant 230 may be disposed on one surface of the support member 210, the tape T attached to the other surface of the support member 210 may be peeled off from the other surface of the support member 210, and the second encapsulant 230 may then be additionally disposed on the other surface of the support member 210 to fill the second through portion 210H and embed the first and second electronic components 221 and 222.

The second encapsulant 230 may be formed to fill at least a portion of the second through portion 210H and cover at least a portion of the support member 210 and each of the first and second electronic components 221 and 222. The second encapsulant 230 may be formed by a known method such as a method of laminating a precursor of the second encapsulant 230 by a known lamination method and then hardening the precursor or a method of applying a precursor material by a known applying method and then hardening the precursor material.

A method of peeling off the tape T is not particularly limited, and may be any known method. For example, when the thermosetting adhesive tape of which adhesion is weakened by heat treatment, the ultraviolet-curable adhesive tape of which adhesion is weakened by ultraviolet ray irradiation, or the like, is used as the tape T, the tape T may be peeled off after the adhesion of the tape T is weakened by heat-treating the tape T or may be peeled off after the adhesion of the tape T is weakened by irradiating the tape T with an ultraviolet ray.

Next, referring to FIGS. 9A through 10B, the first to fourth connection conductor holes 241h, 242h, 243h, and 244h may be formed in the second encapsulants 230 using a mechanical drill, a laser drill, or the like, and through holes VH may be formed at positions adjacent to side surfaces of the second through portion 210H opposing each other. Thereafter, a conductive material may be filled in the first to fourth connection conductor holes 241h, 242h, 243h, and 244h and the through holes VH to form the first to fourth connection conductors 241, 242, 243, and 244 and through vias V.

In this case, each of the through vias V may be formed in a manner of applying a conductive material such as copper along an inner wall of each of the through holes VH, but is not limited thereto, and may also be formed by filling an inner portion of each of the through holes VH by a known plating method. In FIGS. 10A and 10B, a structure in which the conductive material such as copper is applied along the inner wall of each of the through holes VH is illustrated.

Each of the first to fourth connection conductors 241, 242, 243, and 244 may be formed by a known method. For example, each of the first to fourth connection conductors 241, 242, 243, and 244 may be formed by a method of applying a conductive paste to each of via holes by a screen printing method, or may be formed by a known plating method.

Meanwhile, the first and second metal layers 251 and 252 may be formed while forming the first to fourth connection conductors 241, 242, 243, and 244 and the through vias V. As described above, the first and second metal layers 251 and 252 may be disposed to be spaced apart from each other by a predetermined distance with the recess parts R interposed therebetween.

Next, as illustrated in FIGS. 11A and 11B, the electronic component module 200A may be completed by performing cutting along a cutting line C.

Referring to FIG. 12, first, the first through portion 110H may be formed in the core layer 110. Thereafter, referring to FIGS. 13 and 14, a tape T may be attached to the other surface of the core layer 110, and the electronic component module 200A may be disposed in the first through portion 110H.

Figure 15:
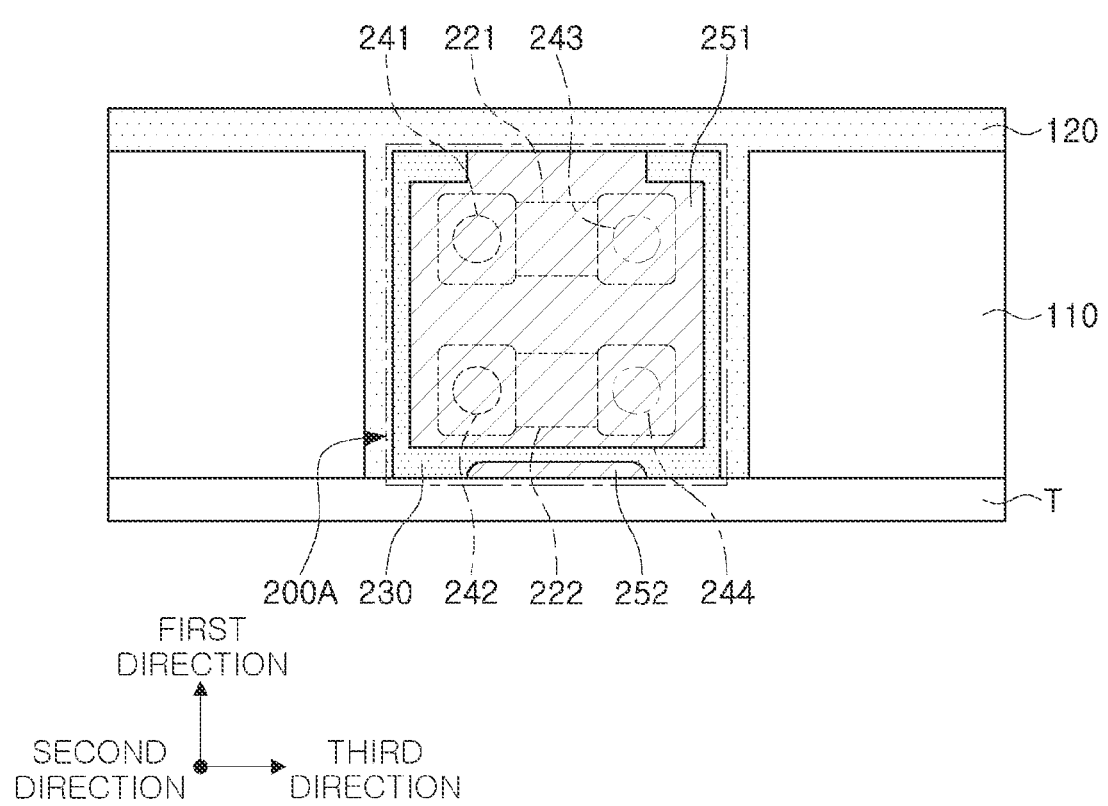
Figure 16:
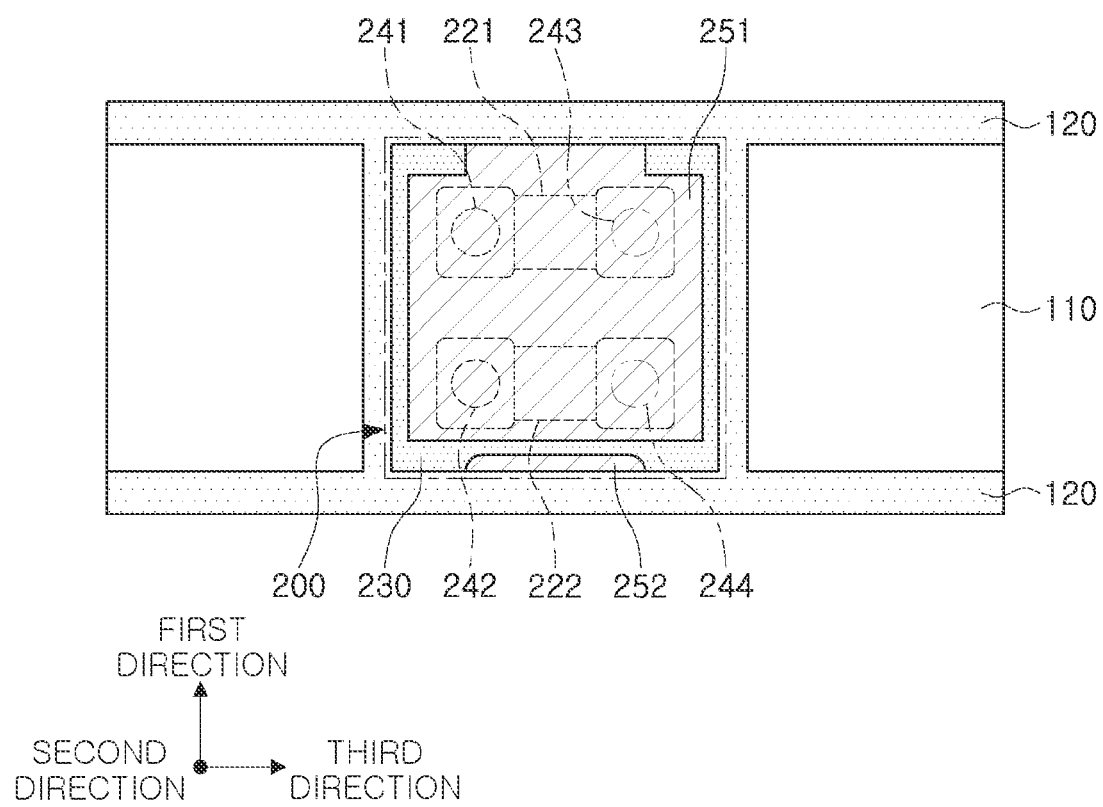

Referring to FIGS. 15 and 16, the first encapsulants 120 may be disposed on one surface and the other surface of the core layer 110 using the same process as the process of disposing the second encapsulants 230 described with reference to FIGS. 7A through 8B.

The first encapsulant 120 may fill at least a portion of the first through portion 110H and cover at least a portion of the electronic component module 200A.

Figure 17:
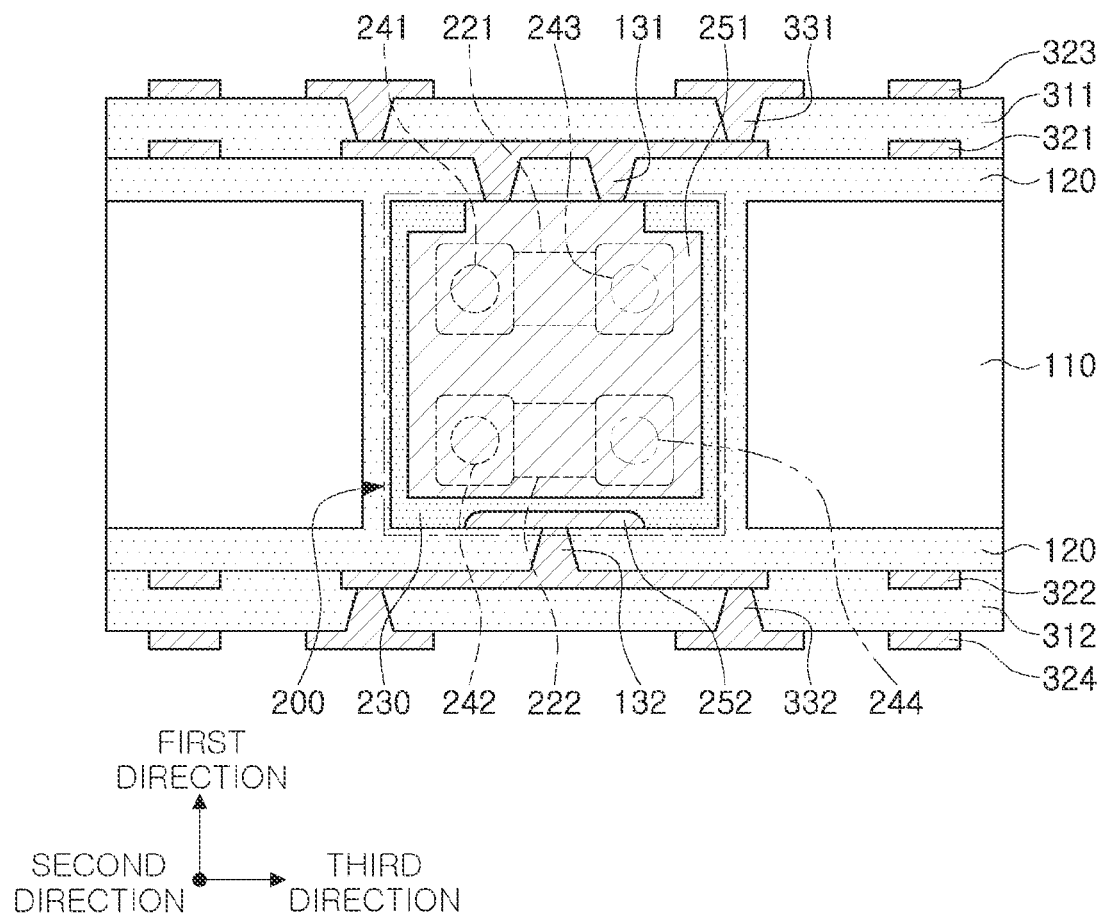

Next, referring to FIG. 17, the first and second wiring vias 131 and 132, and the first and second insulating layers 311 and 312, the first to fourth wiring layers 321, 322, 323, and 324, and the first and second vias 331 and 332 of the build-up structure 300 may be formed.

The first and second wiring vias 131 and 132, the first to fourth wiring layers 321, 322, 323, and 324, and the first and second vias 331 and 332 may be formed by a known method. For example, the first and second wiring vias 131 and 132, the first to fourth wiring layers 321, 322, 323, and 324, and the first and second vias 331 and 332 may be formed by a method of forming through via holes or via holes using a photolithography method, a mechanical drill, a laser drill, or the like, performing patterning with a dry film or the like, and then filling the via holes and the patterned spaces by a plating process or the like.

The first and second insulating layers 311 and 312 may also be formed by a known method such as a method of laminating precursors of the first and second insulating layers 311 and 312 by a known lamination method and then hardening the precursors or a method of applying precursor materials by a known applying method and then hardening the precursor materials.

Figure 18:
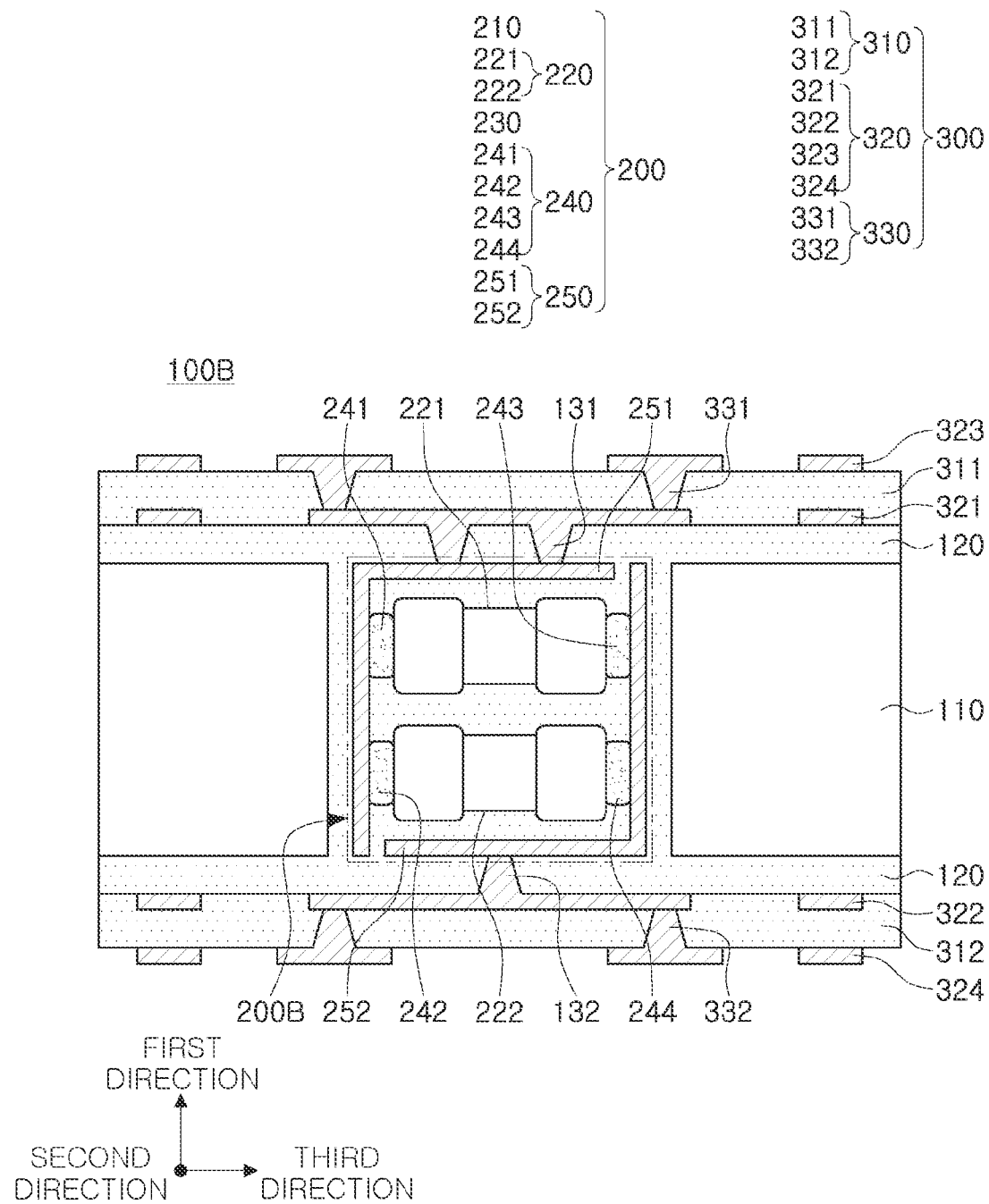
FIG. 18 is a schematic cross-sectional view illustrating an electronic component embedded substrate according to another exemplary embodiment.

FIG. 18 is a schematic cross-sectional view illustrating an electronic component embedded substrate according to another exemplary embodiment.

An electronic component embedded substrate 100B according to another exemplary embodiment is different in a configuration of an electronic component module 200B disposed therein from the electronic component embedded substrate 100A according to an exemplary embodiment. That is, the electronic component embedded substrate 100B according to another exemplary embodiment is different from the electronic component embedded substrate 100A according to an exemplary embodiment in that the electronic component module 200B according to another exemplary embodiment is disposed in the first through portion 110H. Therefore, in the following description, only components different from those of the electronic component embedded substrate 100A according to an exemplary embodiment will be described, and a description of components overlapping those of the electronic component embedded substrate 100A according to an exemplary embodiment will be omitted.

Referring to FIG. 18, the electronic component embedded substrate 100B according to another exemplary embodiment in which the electronic component module 200B according to another exemplary embodiment is disposed in the first through portion 110H is illustrated.

Figure 19:
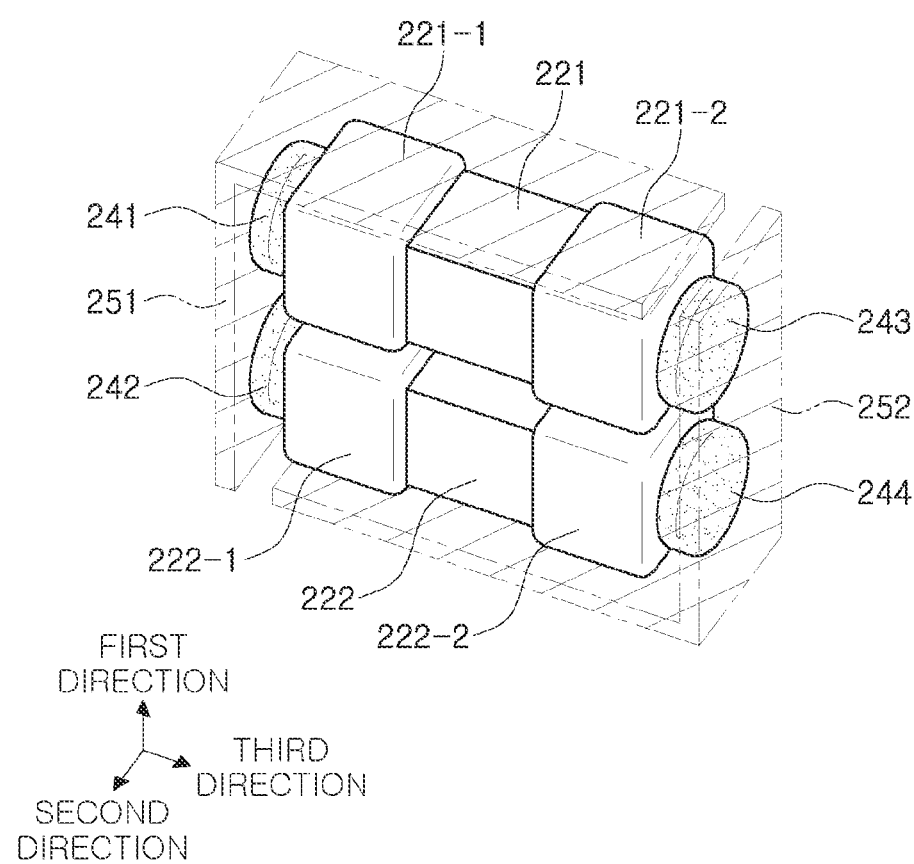
FIG. 19 is a schematic perspective view illustrating an electronic component module according to another exemplary embodiment.

FIG. 19 is a schematic perspective view illustrating an electronic component module 200B according to another exemplary embodiment.

The electronic component module 200B according to another exemplary embodiment may include: first and second electronic components 221 and 222; first and second metal layers 251 and 252 surrounding at least portions of the first and second electronic components 221 and 222; first and second connection conductors 241 and 242 electrically connecting the first and second electronic components 221 and 222 and the first metal layer 251 to each other, respectively; and third and fourth connection conductors 243 and 244 electrically connecting the first and second electronic components 221 and 222 and the second metal layer 252 to each other, respectively.

Specifically, the first connection conductor 241 may electrically connect the first electrode 221-1 of the first electronic component 221 and the first metal layer 251 to each other, and the second connection conductor 242 may electrically connect the first electrode 222-1 of the second electronic component 222 and the first metal layer 251 to each other.

In addition, the third connection conductor 243 may electrically connect the second electrode 221-2 of the first electronic component 221 and the second metal layer 252 to each other, and the fourth connection conductor 244 may electrically connect the second electrode 222-2 of the second electronic component 222 and the second metal layer 252 to each other.

The first and second electronic components 221 and 222 may be vertically arranged to be disposed to at least partially overlap each other when viewed in the first direction. The first and second metal layers 251 and 252 may surround the first and second electronic components 221 and 222 and be electrically connected to the first and second electronic components 221 and 222, and may thus shield the first and second electronic components 221 and 222 from electromagnetic interference (EMI).

Meanwhile, in the electronic component module 200B according to another exemplary embodiment, each of the first to fourth connection conductors 241, 242, 243, and 244 may include a solder and/or a conductive paste. However, a material of each of the first to fourth connection conductors 241, 242, 243, and 244 is not limited thereto, and may be any conductive material that may electrically connect the electronic components 221 and 222 to the first and second metal layers 251 and 252 to each other.

Meanwhile, the electronic component module 200B according to another exemplary embodiment is different from the electronic component module 200A according to an exemplary embodiment in that the first and second electronic components 221 and 222 may not be disposed in a through portion of an insulating layer such as a support member. That is, as illustrated in FIG. 19, the first and second electronic components 221 and 222 may be connected to the first and second metal layers 251 and 252 in a state in which surfaces thereof are externally exposed.

In the electronic component embedded substrate 100B according to another exemplary embodiment, the first encapsulant 120 filling the first through portion 110H of the core layer 110 may cover at least a portion of the electronic component module 200B.

In the electronic component embedded substrate 100B according to another exemplary embodiment, the first encapsulant 120 filling the first through portion 110H of the core layer 110 may cover at least a portion of each of the first and second electronic components 221 and 222. In addition, the first encapsulants 120 may cover at least a portion of each of the first to fourth connection conductors 241, 242, 243, and 244, and embed each of the first to fourth connection conductors 241, 242, 243, and 244.

Unlike the electronic component embedded substrate 100A according to an exemplary embodiment in which the second encapsulants 230 covering the support member 210 cover the electronic components 221 and 222 and the connection conductors 241, 242, 243 and 244, in the electronic component embedded substrate 100B according to another exemplary embodiment, the first encapsulants 120 disposed on one surface and the other surface of the core layer 110 may cover the electronic components 221 and 222 and the connection conductors 241, 242, 243, and 244.

Other contents overlap those described above in the electronic component embedded substrate 100A according to an exemplary embodiment, and a detailed description thereof will thus be omitted.

FIGS. 20 through 23 are cross-sectional views illustrating processes of manufacturing the electronic component embedded substrate of FIG. 18.

Figure 20:
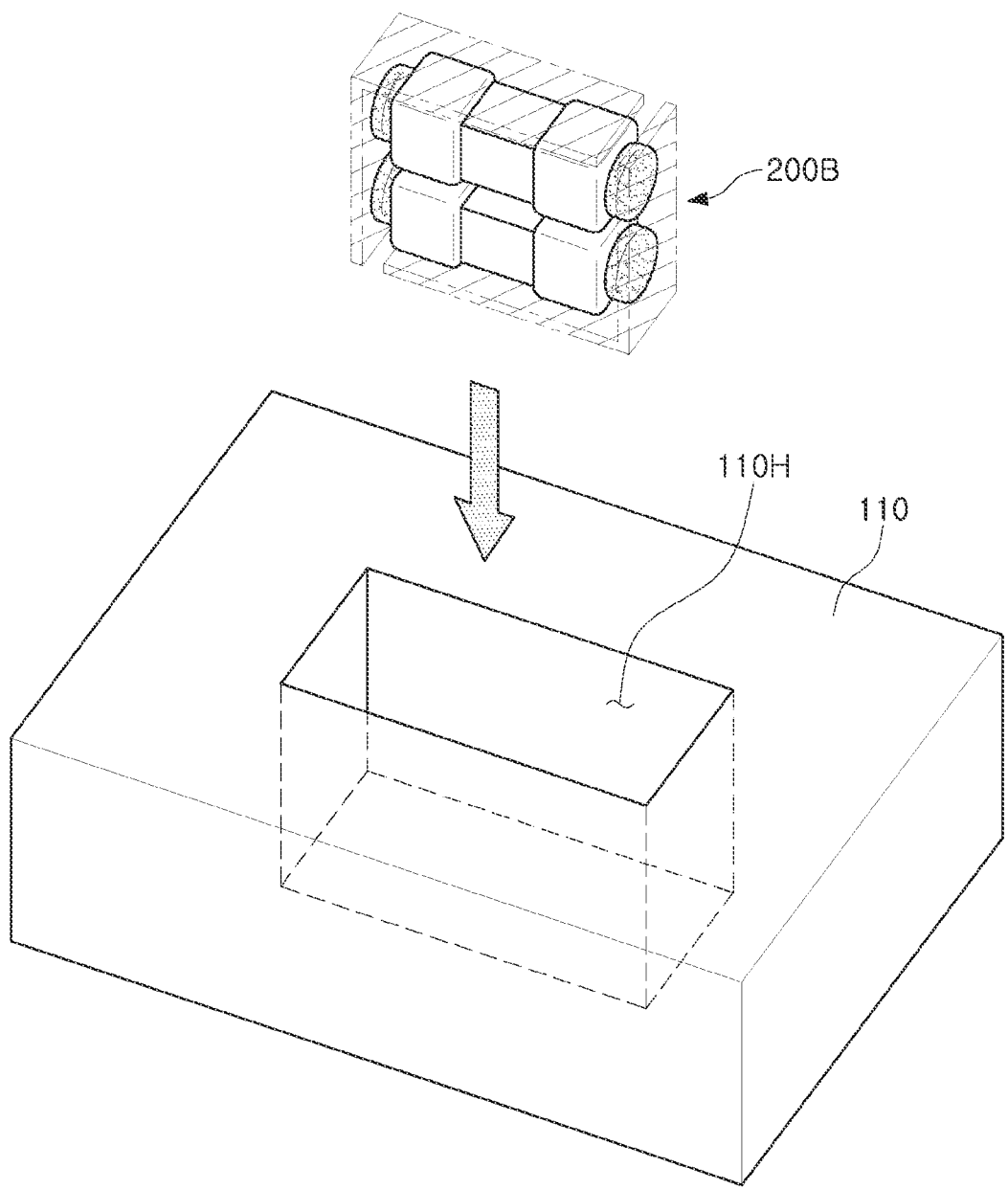
FIGS. 20 through 23 are cross-sectional views illustrating processes of manufacturing the electronic component embedded substrate of FIG. 18.
Figure 21:
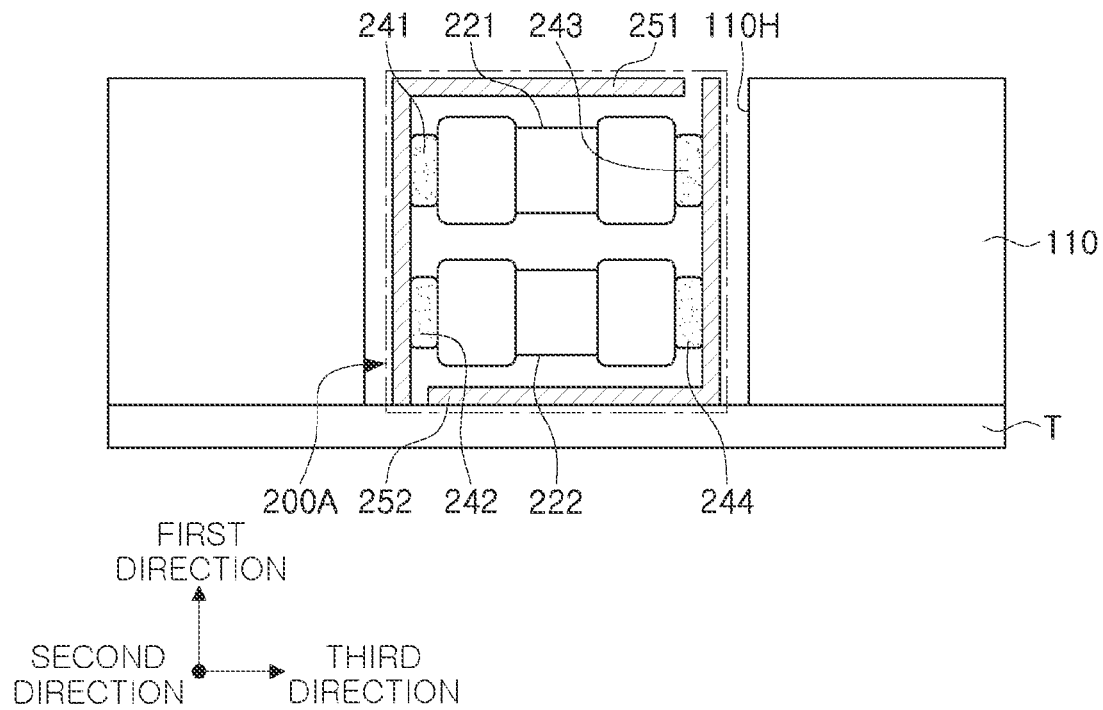
Figure 22:
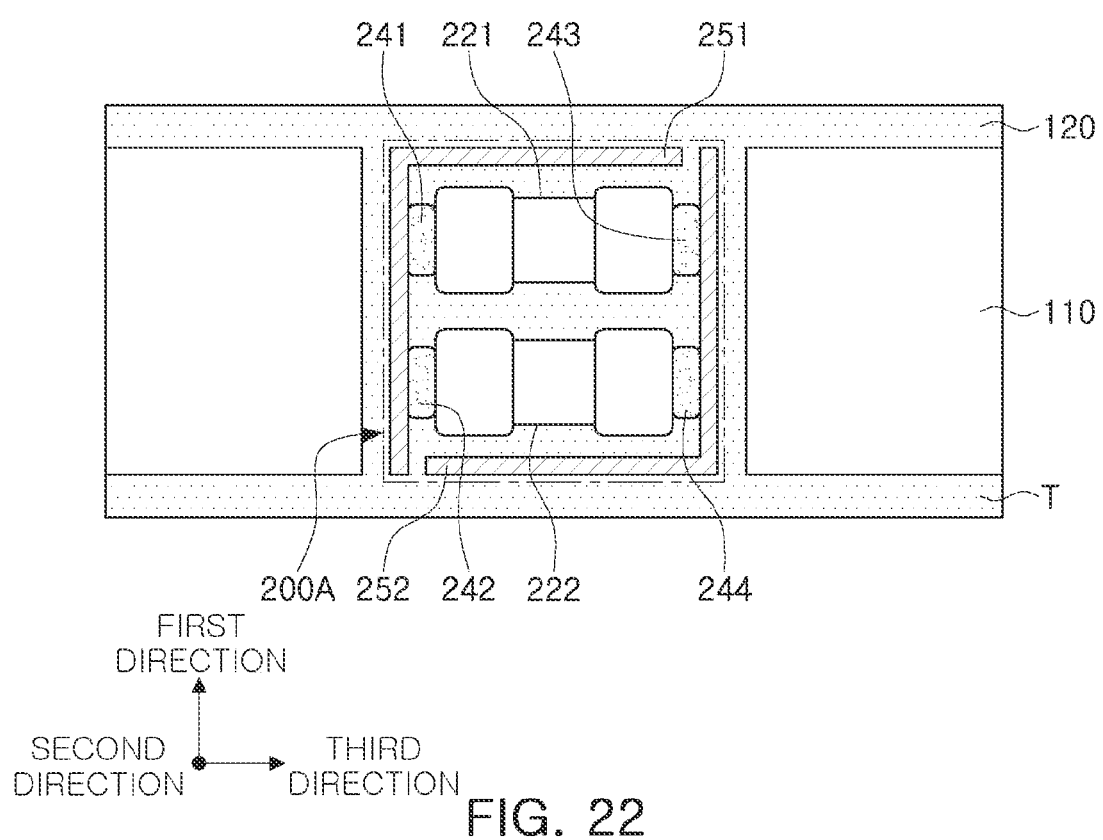

Referring to FIGS. 20 through 22, after the electronic component module 200B according to another exemplary embodiment is embedded in the first through portion 110H, the same processes as the processes of the electronic component embedded substrate 100A according to the exemplary embodiment described above with reference to FIGS. 13 through 16 may be performed.

Figure 23:
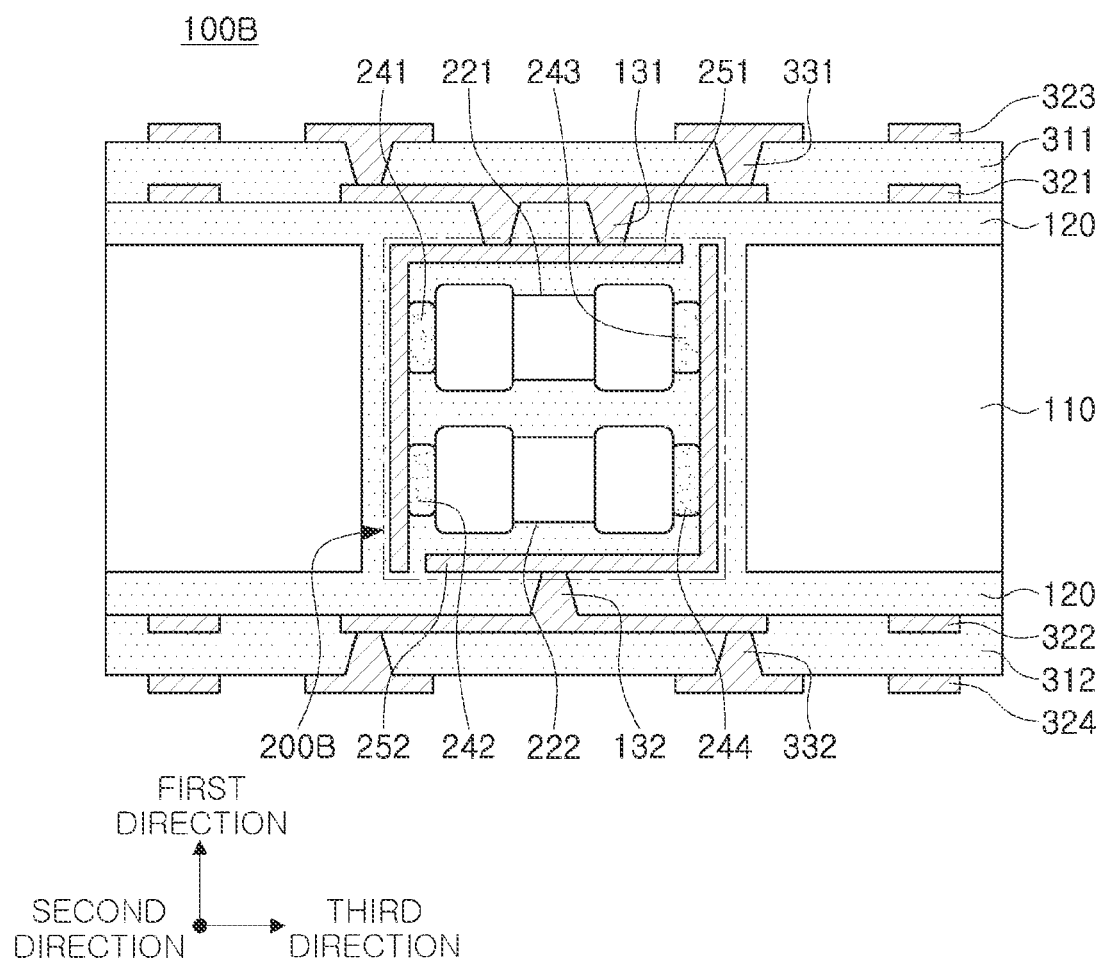

Thereafter, as illustrated in FIG. 23, the first and second wiring vias 131 and 132 may be formed, and the build-up structure 300 may be additionally stacked, such that the electronic component embedded substrate 100B according to another exemplary embodiment illustrated in FIG. 18 may be completed.

Other contents overlap those described above in the electronic component embedded substrate 100A according to an exemplary embodiment, and a detailed description thereof will thus be omitted.

Figure 24:
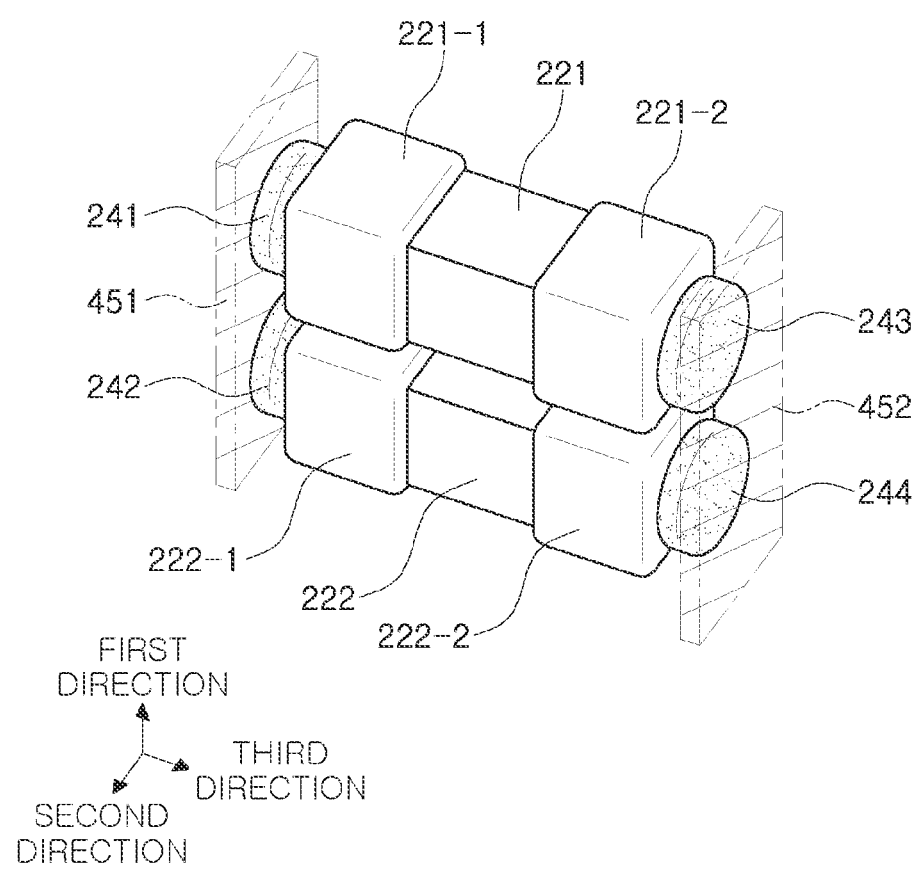
FIG. 24 is a schematic perspective view illustrating an electronic component module according to still another exemplary embodiment.

FIG. 24 is a schematic perspective view illustrating an electronic component module according to still another exemplary embodiment.

Figure 25:
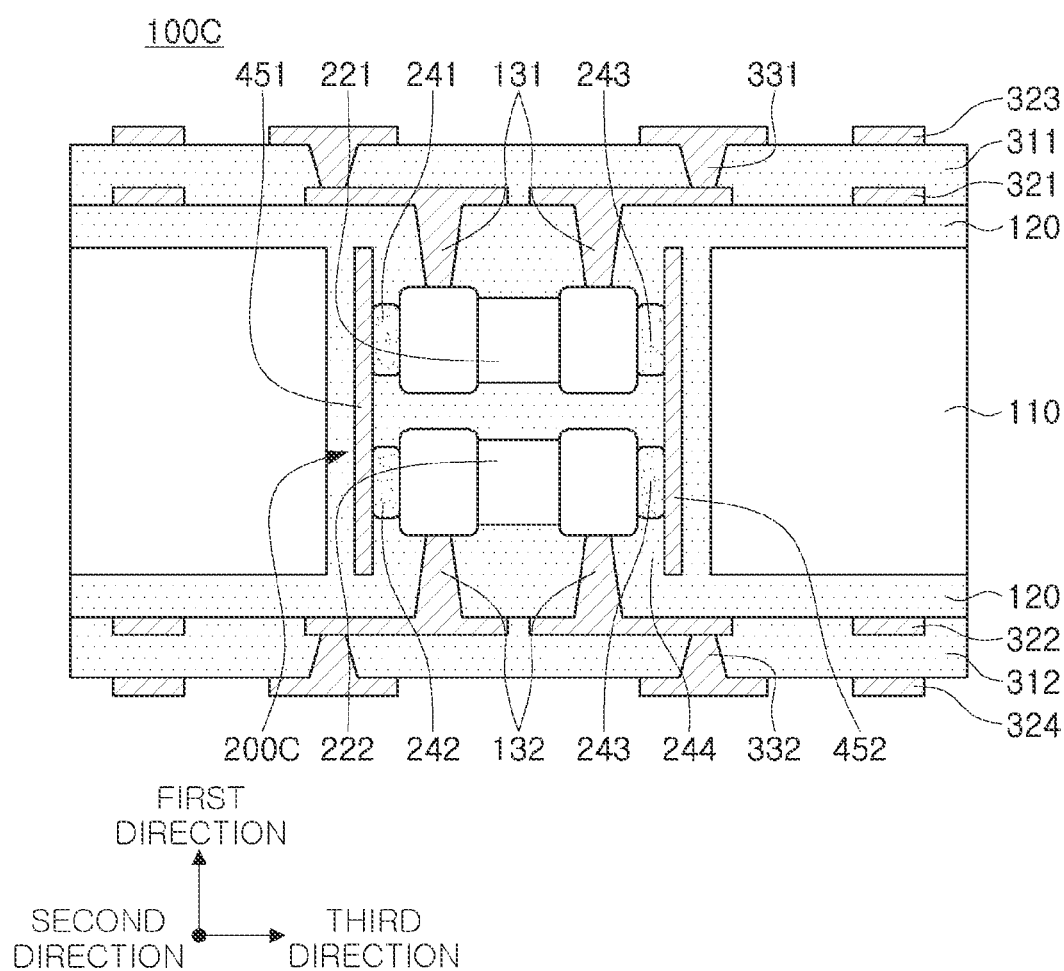
FIG. 25 is a schematic cross-sectional view illustrating an electronic component embedded substrate according to still another exemplary embodiment.

FIG. 25 is a schematic cross-sectional view illustrating an electronic component embedded substrate according to still another exemplary embodiment.

An electronic component embedded substrate 100C according to still another exemplary embodiment is different in a configuration of an electronic component module 200C disposed therein from the electronic component embedded substrate 100B according to another exemplary embodiment. That is, the electronic component embedded substrate 100C according to still another exemplary embodiment is different from the electronic component embedded substrate 100B according to another exemplary embodiment in that first and second metal layers 451 and 452 are disposed only on first and second surfaces of the electronic components 221 and 222, respectively, and the wiring vias 131 and 132 are directly connected to the electrodes of the electronic components 221 and 222. Therefore, in the following description, only components different from those of the electronic component embedded substrate 100B according to another exemplary embodiment will be described, and a description of components overlapping those of the electronic component embedded substrate 100B according to another exemplary embodiment will be omitted.

Referring to FIG. 24, in the electronic component module 200C according to still another exemplary embodiment, the first and second metal layers 451 and 452 may be disposed only on side surfaces of one or more electronic components 221 and 222. Specifically, the first and second metal layers 451 and 452 may be disposed, respectively, on the first and second surfaces of one or more electronic components 221 and 222 opposing each other, and the electronic components 221 and 222 may be connected to each other in parallel by the first and second metal layers 451 and 452.

Meanwhile, in the present exemplary embodiment, the first and second metal layers 451 and 452 may include stainless steel (STS) (steel use stainless (SUS)), and may be in contact with and connected to at least some of the first to fourth connection conductors 241, 242, 243, and 244, respectively.

In addition, referring to FIG. 25, in the electronic component embedded substrate 100C according to still another exemplary embodiment, the first wiring vias 131 may be in contact with and connected to the first and second electrodes 221-1 and 221-2 of the first electronic component 221, and the second wiring vias 132 may be in contact with and connected to the first and second electrodes 222-1 and 222-2 of the second electronic component 222.

Other contents overlap those described above in the electronic component embedded substrate 100B according to another exemplary embodiment, and a detailed description thereof will thus be omitted.

Figure 26:
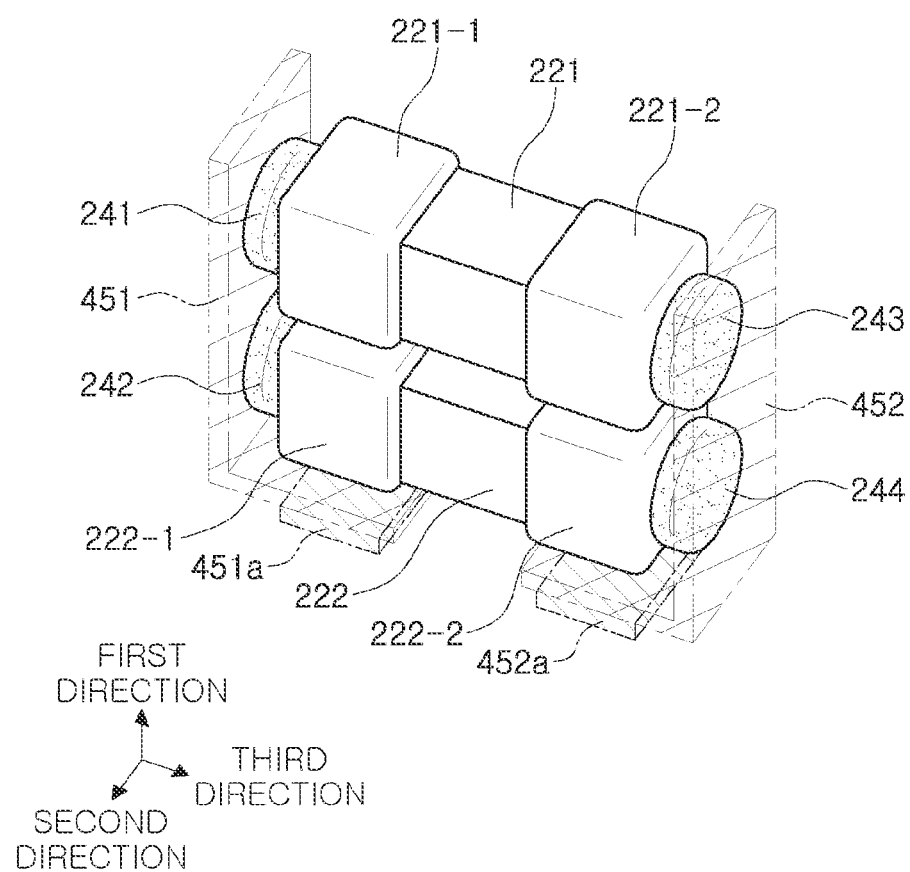
FIG. 26 is a schematic perspective view illustrating an electronic component module according to still another exemplary embodiment.

FIG. 26 is a schematic perspective view illustrating an electronic component module according to still another exemplary embodiment.

Figure 27:
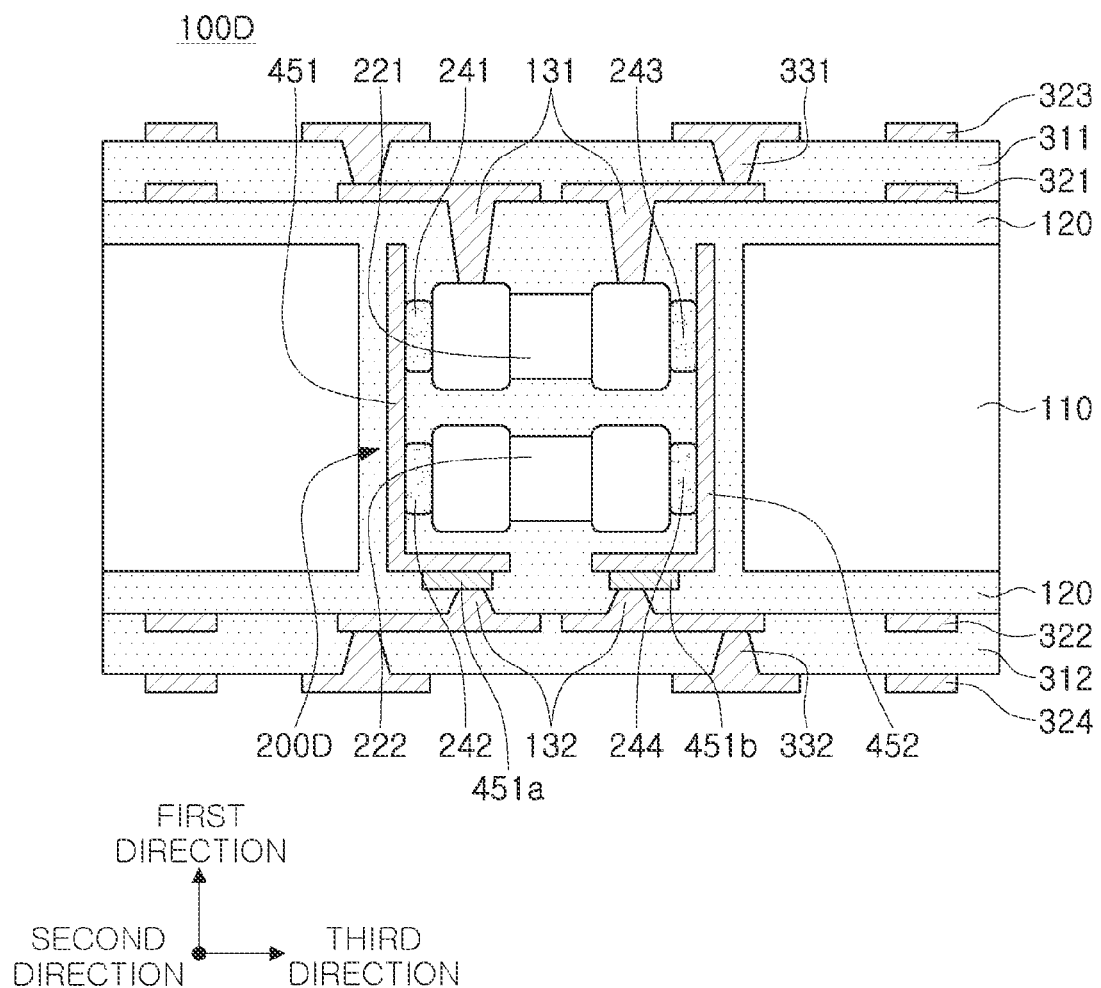
FIG. 27 is a schematic cross-sectional view illustrating an electronic component embedded substrate according to still another exemplary embodiment.

FIG. 27 is a schematic cross-sectional view illustrating an electronic component embedded substrate according to still another exemplary embodiment.

An electronic component embedded substrate 100D according to still another exemplary embodiment is different in a configuration of an electronic component module 200D disposed therein from the electronic component embedded substrate 100C according to still another exemplary embodiment. That is, in the electronic component embedded substrate 100D according to still another exemplary embodiment, the first and second metal layers 451 and 452 are not disposed only on the first and second surfaces of the electronic components 221 and 222, respectively, and may also extend to and disposed on lower surfaces of the electronic components 221 and 222.

In addition, the electronic component embedded substrate 100D according to still another exemplary embodiment is different from the electronic component embedded substrate 100C according to still another exemplary embodiment in that the wiring vias 131 and 132 are in contact with and connected to the first and second metal layers 451 and 452. Therefore, in the following description, only components different from those of the electronic component embedded substrate 100C according to still another exemplary embodiment will be described, and a description of components overlapping those of the electronic component embedded substrate 100C according to still another exemplary embodiment will be omitted.

Referring to FIG. 26, in the electronic component module 200D according to the present exemplary embodiment, the first and second metal layers 451 and 452 may be disposed not only on the side surfaces of one or more electronic components 221 and 222, but may also extend to and be disposed on the lower surfaces of one or more electronic components 221 and 222. That is, the first and second metal layers 451 and 452 may have bent portions to surround the electronic components 221 and 222 in wider areas.

Meanwhile, in the present exemplary embodiment, the first and second metal layers 451 and 452 may further include first layers including stainless steel and second layers 451a and 452a disposed on surfaces of the first layers and including copper (Cu), respectively. The second layers 451a and 452a may be plated and formed, respectively, on the first and second metal layers 451 and 452 disposed on the lower surfaces of the electronic components 221 and 222, and later wiring vias 131 and 132, and may include copper (Cu) so as to improve close adhesion between the wiring vias 131 and 132 and the first and second metal layers 451 and 452 later.

Referring to FIG. 27, the electronic component embedded substrate 100D according to still another exemplary embodiment is illustrated. In this case, the first wiring vias 131 may be in contact with and connected to the first and second electrodes 221-1 and 221-2 of the first electronic component 221, and the second wiring vias 132 may be in contact with and connected to the second layers 451a and 452a of the first and second metal layers 451 and 452. When the second wiring vias 132 include copper plating layers, high close adhesion between the second wiring vias 132 and the second layers 451a and 452a including copper may be maintained.

Other contents overlap those described above in the electronic component embedded substrate 100C according to still another exemplary embodiment, and a detailed description thereof will thus be omitted.

Figure 28:
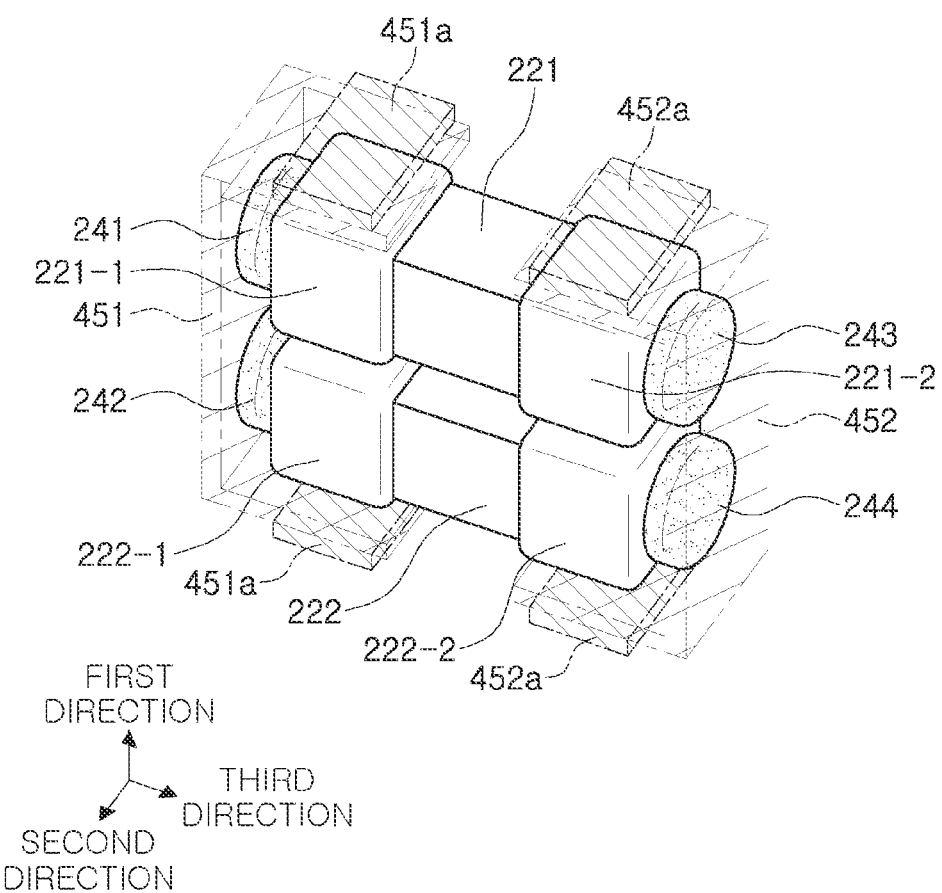
FIG. 28 is a schematic perspective view illustrating an electronic component module according to still another exemplary embodiment.

FIG. 28 is a schematic perspective view illustrating an electronic component module according to still another exemplary embodiment.

Figure 29:
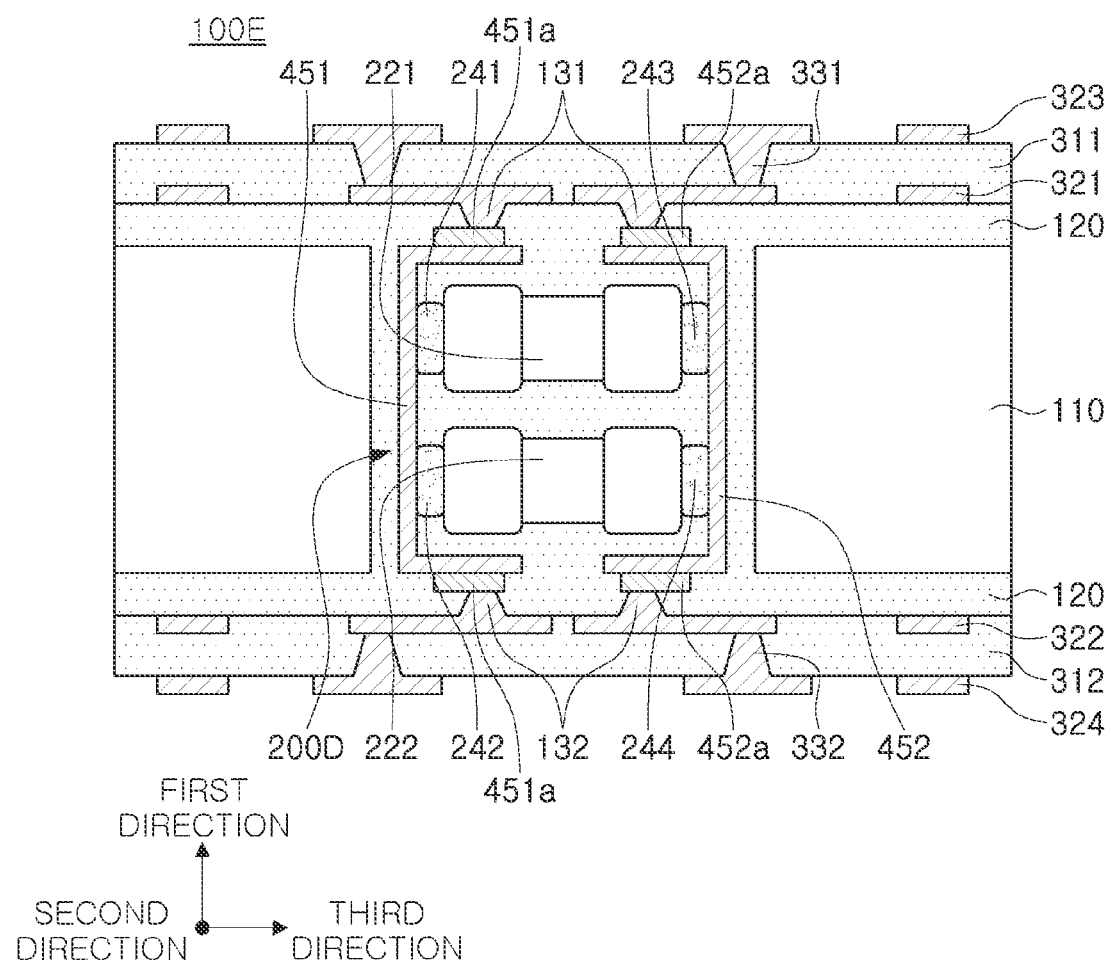
FIG. 29 is a schematic cross-sectional view illustrating an electronic component embedded substrate according to still another exemplary embodiment.

FIG. 29 is a schematic cross-sectional view illustrating an electronic component embedded substrate according to still another exemplary embodiment.

An electronic component embedded substrate 100E according to still another exemplary embodiment is different in a configuration of an electronic component module 200E disposed therein from the electronic component embedded substrate 100D according to still another exemplary embodiment. That is, in the electronic component embedded substrate 100E according to still another exemplary embodiment, the first and second metal layers 451 and 452 may also extend to and be disposed on upper surfaces of the electronic components 221 and 222.

In addition, the electronic component embedded substrate 100E according to still another exemplary embodiment is different from the electronic component embedded substrate 100D according to still another exemplary embodiment in that the wiring vias 131 and 132 are in contact with and connected to the first and second metal layers 451 and 452 to be electrically connected to the electronic components 221 and 222. Therefore, in the following description, only components different from those of the electronic component embedded substrate 100D according to still another exemplary embodiment will be described, and a description of components overlapping those of the electronic component embedded substrate 100D according to still another exemplary embodiment will be omitted.

Referring to FIG. 28, in the electronic component module 200E according to the present exemplary embodiment, the first and second metal layers 451 and 452 may be disposed not only on the side surfaces of one or more electronic components 221 and 222, but may also extend to and be disposed on at least portions of each of the lower surfaces and the upper surfaces of one or more electronic components 221 and 222. That is, the first and second metal layers 451 and 452 may be bent in a plurality of areas to surround the electronic components 221 and 222 in wider areas.

Meanwhile, in the present exemplary embodiment, the first and second metal layers 451 and 452 may further include first layers including stainless steel and second layers 451a and 452a disposed on surfaces of the first layers and including copper (Cu), respectively. The second layers 451a and 452a may be plated and formed, respectively, on the first and second metal layers 451 and 452 disposed on the lower surfaces and the upper surfaces of the electronic components 221 and 222, and later wiring vias 131 and 132, and may include copper (Cu) so as to improve close adhesion between the wiring vias 131 and 132 and the first and second metal layers 451 and 452 later.

Referring to FIG. 29, the electronic component embedded substrate 100E according to still another exemplary embodiment is illustrated. In this case, the first and second wiring vias 131 and 132 may be in contact with and connected to the second layers 451a and 452a of the first and second metal layers 451 and 452. When the first and second wiring vias 131 and 132 include copper plating layers, high close adhesion between the first and second wiring vias 131 and 132 and the second layers 451a and 452a including copper may be maintained.

Other contents overlap those described above in the electronic component embedded substrate 100D according to still another exemplary embodiment, and a detailed description thereof will thus be omitted.

Meanwhile, the electronic component embedded substrates 100A, 100B, 100C, 100D, or 100E disclosed herein may be mounted on a mainboard (not illustrated) through a separate electrical connection metals (not illustrated).

As set forth above, according to an exemplary embodiment in the present disclosure, an electronic component embedded substrate in which at least one electronic component is embedded in a through portion may be provided.

In addition, an electronic component embedded substrate in which a plurality of electronic components are embedded by increasing a mounting density of the electronic components may be provided.

Further, an electronic component embedded substrate with decreased parasitic inductance may be provided.

Further, an electronic component embedded substrate having improved signal transmission performance by integration of signals and power may be provided.

While exemplary embodiments have been shown and described above, it will be apparent to those skilled in the art that modifications and variations could be made without departing from the scope of the present invention as defined by the appended claims.

What is claimed is:

1. An electronic component embedded substrate comprising:
a core layer having a first through portion;
an electronic component module including a support member having a second through portion in which at least one electronic component is disposed, a second encapsulant covering at least a portion of the at least one electronic component, and a first metal layer and a second metal layer disposed apart from each other and disposed on the second encapsulant to be surrounding at least a portion of the electronic component, the electronic component module disposed in the first through portion; and
a first encapsulant disposed on the core layer, disposed in at least a portion of the first through portion, and covering at least a portion of the electronic component module.

2. The electronic component embedded substrate of claim 1, wherein the at least one electronic component includes a capacitor having an electrode.

3. The electronic component embedded substrate of claim 1, wherein a direction in which the first through portion penetrates through the core layer crosses a direction in which the second through portion penetrates through the support member.

4. The electronic component embedded substrate of claim 1, wherein the metal layer is disposed on at least a portion of the second encapsulant, and
the electronic component module includes a connection conductor penetrating through at least a portion of the second encapsulant and connecting the metal layer and the at least one electronic component to each other.

5. The electronic component embedded substrate of claim 4, wherein the metal layer extends to and is disposed on at least a portion of the support member.

6. The electronic component embedded substrate of claim 4, wherein the metal layer exposes at least a portion of the second encapsulant, and
the exposed second encapsulant is in contact with the first encapsulant.

7. The electronic component embedded substrate of claim 6, wherein the metal layer includes first and second metal layers disposed on one surface and the other surface of the second encapsulant opposing each other, and the first and second metal layers are disposed to be spaced apart from each other so as to face each other.

8. The electronic component embedded substrate of claim 1, further comprising:
a build-up structure disposed on the first encapsulant and including a plurality of insulating layers, a plurality of wiring layers, and a plurality of vias; and
wiring vias penetrating through at least portions of the first encapsulant and connecting one of the plurality of wiring layers and the metal layer to each other.

9. The electronic component embedded substrate of claim 1, wherein the first encapsulant covers at least a portion of the at least one electronic component.

10. The electronic component embedded substrate of claim 9, wherein the electronic component module further includes a connection conductor penetrating through the first encapsulant and connecting the at least one electronic component and the metal layer to each other, and
the connection conductor includes at least one of a solder and a conductive paste.

11. The electronic component embedded substrate of claim 10, wherein the metal layer includes first and second metal layers spaced apart from each other,
the at least one electronic component has first and second surfaces opposing each other,
the connection conductor connected to the first metal layer is in contact with and connected to the first surface of the at least one electronic component,
the connection conductor connected to the second metal layer is in contact with and connected to the second surface of the at least one electronic component, and
at least a portion of the connection conductor is covered by the first encapsulant.

12. The electronic component embedded substrate of claim 11, further comprising:
a build-up structure disposed on the first encapsulant and including a plurality of insulating layers, a plurality of wiring layers, and a plurality of vias; and
wiring vias penetrating through at least a portion of the first encapsulant and connecting one of the plurality of wiring layers and the at least one electronic component to each other.

13. The electronic component embedded substrate of claim 12, wherein the wiring vias are in contact with and connected to each of the first and second metal layers.

14. The electronic component embedded substrate of claim 12, wherein each of the first and second metal layers further includes a first layer including stainless steel and a second layer disposed on a surface of the first layer and including copper (Cu), and
the wiring vias are in contact with and connected to the second layer of each of the first and second metal layers.

15. The electronic component embedded substrate of claim 12, wherein each of the first and second metal layers includes stainless steel, and
the wiring vias are in contact with and connected to an electrode of the at least one electronic component.

16. The electronic component embedded substrate of claim 12, wherein each of the first and second metal layers further includes a first layer including stainless steel and a second layer disposed on a surface of the first layer and including copper (Cu),
at least some of the wiring vias are in contact with and connected to the second layer of each of the first and second metal layers, and
at least the others of the wiring vias are in contact with and connected to an electrode of the at least one electronic component.

17. The electronic component embedded substrate of claim 1, wherein the electronic component module further includes a recess separating the first and second metal layers such that the second encapsulant is exposed through the recess to be in contact with the first encapsulant.

18. An electronic component embedded substrate comprising:
a core layer having a first through portion penetrating through the core layer in a thickness direction of the core layer;
an electronic component module disposed in the first through portion and including a support member, a second through portion penetrating the support member in a width direction, a plurality of electronic components disposed in the second through portion to at least partially overlap each other when viewed in the thickness direction, a first metal layer and a second metal layer spaced apart from the first metal layer, the first and second metal layers surrounding at least portions of the plurality of electronic components; and
a first encapsulant disposed on the core layer, disposed in at least a portion of the first through portion, and covering at least a portion of the electronic component module,
wherein the first encapsulant is in contact with at least portions of the plurality of electronic components.

19. The electronic component embedded substrate of claim 18, wherein electrodes of the plurality of electronic components are connected to each other through at least the metal layer.

20. The electronic component embedded substrate of claim 19, further comprising:
a wiring layer disposed on the first encapsulant; and
a via in the first encapsulant connecting the wiring layer to one of the electrodes of the plurality of electronic components.

21. An electronic component embedded substrate comprising:
a core layer having an upper surface and a lower surface, and including a first through portion penetrating through the upper surface and the lower surface;
a first electronic component disposed in the first through portion;
a second encapsulant covering the first electronic component;
a first metal layer disposed on the second encapsulant and in the first through portion and including a first portion extending in a direction from the upper surface to the lower surface;
a first connection conductor penetrating the second encapsulant and extending from the first portion to connect to the first electronic component; and
a first encapsulant disposed on the core layer and disposed in at least a portion of the first through portion.

22. The electronic component embedded substrate of claim 21, wherein the first portion is disposed between a wall of the first through portion and the first electronic component, and
the first connection conductor is tapered in a direction from the first portion to the first electronic component.

23. The electronic component embedded substrate of claim 21, further comprising a first wiring layer disposed on one side of the encapsulant,
wherein the first metal layer further includes a second portion bent from the first portion and extending between the first wiring layer and the first electronic component, and
the electronic component embedded substrate further comprises a first wiring via connecting the first wiring layer and the second portion to each other.

24. The electronic component embedded substrate of claim 23, further comprising:
a second wiring layer disposed on another side of the encapsulant;
a second metal layer disposed in the first through portion, and including a third portion extending in the direction from the upper surface to the lower surface, and a fourth portion bent from the third portion and extending between the second wiring layer and the first electronic component;
a second connection conductor extending from the third portion to connect to the first electronic component; and
a second wiring via connecting the second wiring layer and the fourth portion to each other.

25. The electronic component embedded substrate of claim 24, wherein the first connection conductor and the second connection conductor are tapered opposite to each other.

26. The electronic component embedded substrate of claim 21, further comprising:
a second electronic component stacked on the first electronic component in a direction from the upper surface to the lower surface; and
a third connection conductor extending from the first portion to connect to the second electronic component.

* * * * *